(12) United States Patent
Tang et al.

(10) Patent No.: US 11,049,716 B2
(45) Date of Patent: Jun. 29, 2021

(54) GAP FILL USING CARBON-BASED FILMS

(71) Applicant: Lam Research Corporation, Fremont, CA (US)

(72) Inventors: Wei Tang, Fremont, CA (US); Jason Daejin Park, Lake Oswego, OR (US); Bart J. van Schravendijk, Palo Alto, CA (US); Shu Tsai Wang, Dublin, CA (US); Kaihan Abidi Ashtiani, Cupertino, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/194,102

(22) Filed: Nov. 16, 2018

(65) Prior Publication Data
US 2019/0181004 A1 Jun. 13, 2019

Related U.S. Application Data

(63) Continuation of application No. 14/692,627, filed on Apr. 21, 2015, now abandoned.

(51) Int. Cl.
*H01L 21/02* (2006.01)
*H01L 21/768* (2006.01)
(Continued)

(52) U.S. Cl.
CPC ...... *H01L 21/02274* (2013.01); *C23C 16/045* (2013.01); *C23C 16/26* (2013.01); *C23C 16/325* (2013.01); *H01L 21/02115* (2013.01); *H01L 21/02167* (2013.01); *H01L 21/02211* (2013.01); *H01L 21/76224* (2013.01); *H01L 21/76837* (2013.01)

(58) Field of Classification Search
None
See application file for complete search history.

(56) References Cited

U.S. PATENT DOCUMENTS

| 4,177,474 A | 12/1979 | Ovshinsky |
| 4,532,150 A | 7/1985 | Endo et al. |

(Continued)

FOREIGN PATENT DOCUMENTS

| CA | 868641 A | 4/1971 |
| CN | 1714168 A | 12/2005 |

(Continued)

OTHER PUBLICATIONS

U.S. Office Action dated Dec. 19, 2014 issued in U.S. Appl. No. 13/907,699.

(Continued)

*Primary Examiner* — Zandra V Smith
*Assistant Examiner* — Andre C Stevenson
(74) *Attorney, Agent, or Firm* — Weaver Austin Villeneuve & Sampson LLP

(57) ABSTRACT

Provided herein are methods of filling gaps using high density plasma chemical vapor deposition (HDP CVD). According to various implementations, carbon-containing films such as amorphous carbon and amorphous carbide films are deposited by HDP CVD into gaps on substrates to fill the gaps. The methods may involve using high hydrogen-content process gasses during HDP CVD deposition to provide bottom-up fill. Also provided are related apparatus.

13 Claims, 8 Drawing Sheets

(51) Int. Cl.
*H01L 21/762* (2006.01)
*C23C 16/04* (2006.01)
*C23C 16/26* (2006.01)
*C23C 16/32* (2006.01)

(56) References Cited

U.S. PATENT DOCUMENTS

| | | | |
|---|---|---|---|
| 4,656,110 A | 4/1987 | Yamazaki |
| 4,783,368 A | 11/1988 | Yamamoto et al. |
| 4,895,789 A | 1/1990 | Motte et al. |
| 4,952,658 A | 8/1990 | Kalchauer et al. |
| 5,034,355 A | 7/1991 | Tani et al. |
| 5,108,965 A | 4/1992 | Tani et al. |
| 5,122,431 A | 6/1992 | Kodama et al. |
| 5,324,690 A | 6/1994 | Gelatos et al. |
| 5,447,816 A | 9/1995 | Kodama et al. |
| 5,464,699 A | 11/1995 | Baldi |
| 5,518,572 A | 5/1996 | Kinoshita et al. |
| 5,567,243 A | 10/1996 | Foster et al. |
| 5,654,208 A | 8/1997 | Harris et al. |
| 5,739,579 A | 4/1998 | Chiang et al. |
| 5,807,615 A | 9/1998 | Sindzingre et al. |
| 5,958,324 A | 9/1999 | Bujalski et al. |
| 5,981,398 A | 11/1999 | Tsai et al. |
| 6,030,881 A | 2/2000 | Papasouliotis et al. |
| 6,045,877 A | 4/2000 | Gleason et al. |
| 6,100,587 A | 8/2000 | Merchant et al. |
| 6,150,719 A | 11/2000 | Saia et al. |
| 6,159,871 A | 12/2000 | Loboda et al. |
| 6,197,688 B1 | 3/2001 | Simpson |
| 6,215,087 B1 | 4/2001 | Akahori et al. |
| 6,242,686 B1 | 6/2001 | Kishimoto et al. |
| 6,262,445 B1 | 7/2001 | Swanson et al. |
| 6,316,167 B1 | 11/2001 | Angelopoulos et al. |
| 6,352,945 B1 | 3/2002 | Matsuki |
| 6,365,527 B1 | 4/2002 | Yang et al. |
| 6,383,299 B1 | 5/2002 | Yuda et al. |
| 6,383,898 B1 | 5/2002 | Kishimoto |
| 6,383,955 B1 | 5/2002 | Matsuki et al. |
| 6,395,150 B1 | 5/2002 | Van Cleemput et al. |
| 6,399,484 B1 | 6/2002 | Yamasaki et al. |
| 6,410,419 B1 | 6/2002 | Merchant et al. |
| 6,417,092 B1 | 7/2002 | Jain et al. |
| 6,424,044 B1 | 7/2002 | Han et al. |
| 6,432,846 B1 | 8/2002 | Matsuki |
| 6,448,186 B1 * | 9/2002 | Olson ............... H01L 21/02211 438/758 |
| 6,448,666 B1 | 9/2002 | Kudo et al. |
| 6,455,409 B1 | 9/2002 | Subramanian et al. |
| 6,465,366 B1 | 10/2002 | Nemani et al. |
| 6,465,372 B1 | 10/2002 | Xia et al. |
| 6,506,692 B2 | 1/2003 | Andideh |
| 6,576,345 B1 | 6/2003 | Van Cleemput et al. |
| 6,624,064 B1 * | 9/2003 | Sahin ................ C23C 16/4404 438/627 |
| 6,670,715 B2 | 12/2003 | Yang et al. |
| 6,713,390 B2 * | 3/2004 | M'Saad ............... C23C 16/325 438/680 |
| 6,764,958 B1 | 7/2004 | Nemani et al. |
| 6,767,836 B2 | 7/2004 | San et al. |
| 6,774,489 B2 | 8/2004 | Russell et al. |
| 6,790,767 B2 | 9/2004 | Lee |
| 6,790,788 B2 | 9/2004 | Li et al. |
| 6,846,391 B1 | 1/2005 | Papasouliotis et al. |
| 6,849,561 B1 | 2/2005 | Goundar |
| 6,851,384 B2 | 2/2005 | Yuda et al. |
| 6,855,645 B2 | 2/2005 | Tang et al. |
| 6,875,687 B1 | 4/2005 | Weidman et al. |
| 6,881,683 B2 | 4/2005 | Matsuki et al. |
| 6,890,850 B2 | 5/2005 | Lee et al. |
| 6,919,270 B2 | 7/2005 | Satoh et al. |
| 6,930,013 B2 | 8/2005 | Choi et al. |
| 6,935,553 B2 | 8/2005 | Suga et al. |
| 6,949,450 B2 | 9/2005 | Chiang et al. |
| 6,967,405 B1 | 11/2005 | Yu et al. |
| 6,991,959 B2 | 1/2006 | Goundar et al. |
| 7,064,088 B2 | 6/2006 | Hyodo et al. |
| 7,091,137 B2 | 8/2006 | Lee et al. |
| 7,115,534 B2 | 10/2006 | Nguyen et al. |
| 7,163,889 B2 | 1/2007 | Yu et al. |
| 7,163,896 B1 | 1/2007 | Zhu et al. |
| 7,200,460 B2 | 4/2007 | Campana et al. |
| 7,239,017 B1 | 7/2007 | Yu et al. |
| 7,253,125 B1 | 8/2007 | Bandyopadhyay et al. |
| 7,256,139 B2 * | 8/2007 | Moghadam ....... H01L 21/76829 438/758 |
| 7,282,438 B1 | 10/2007 | Yu et al. |
| 7,381,662 B1 | 6/2008 | Niu et al. |
| 7,420,275 B1 | 9/2008 | Yu et al. |
| 7,468,290 B2 | 12/2008 | Lukas et al. |
| 7,524,735 B1 | 4/2009 | Gauri et al. |
| 7,573,061 B1 | 8/2009 | Yu et al. |
| 7,622,400 B1 | 11/2009 | Fox et al. |
| 7,662,355 B2 | 2/2010 | Kamisako et al. |
| 7,709,063 B2 | 5/2010 | Yuda et al. |
| 7,736,728 B2 | 6/2010 | Loboda et al. |
| 7,842,604 B1 | 11/2010 | Yu et al. |
| 7,915,166 B1 | 3/2011 | Yu et al. |
| 7,923,385 B2 | 4/2011 | Wu et al. |
| 7,968,436 B1 | 6/2011 | Yu et al. |
| 8,021,992 B2 | 9/2011 | Liou et al. |
| 8,053,372 B1 | 11/2011 | Greer et al. |
| 8,084,339 B2 | 12/2011 | Antonelli et al. |
| 8,110,493 B1 | 2/2012 | Subramonium et al. |
| 8,124,522 B1 | 2/2012 | Wu et al. |
| 8,168,268 B2 | 5/2012 | Ovshinsky |
| 8,173,537 B1 | 5/2012 | Chattopadhyay et al. |
| 8,178,168 B2 | 5/2012 | O'Neill et al. |
| 8,178,443 B2 | 5/2012 | Rangarajan et al. |
| 8,217,513 B2 | 7/2012 | Antonelli et al. |
| 8,227,352 B2 | 7/2012 | Yu et al. |
| 8,247,332 B2 | 8/2012 | Rangarajan et al. |
| 8,669,181 B1 | 3/2014 | Yu et al. |
| 8,846,525 B2 | 9/2014 | Rangarajan et al. |
| 8,864,935 B2 | 10/2014 | Fair et al. |
| 8,916,022 B1 | 12/2014 | Caron |
| 8,927,442 B1 | 1/2015 | Angyal et al. |
| 9,023,731 B2 | 5/2015 | Ji et al. |
| 9,234,276 B2 | 1/2016 | Varadarajan |
| 9,337,068 B2 | 5/2016 | Antonelli et al. |
| 9,362,133 B2 | 6/2016 | Shamma et al. |
| 9,371,579 B2 | 6/2016 | Varadarajan et al. |
| 9,391,086 B1 | 7/2016 | Soda et al. |
| 9,591,738 B2 | 3/2017 | Qiu et al. |
| 9,837,270 B1 | 12/2017 | Varadarajan et al. |
| 10,002,787 B2 | 6/2018 | Yu et al. |
| 10,192,759 B2 | 1/2019 | Shamma et al. |
| 10,211,310 B2 | 2/2019 | Varadarajan |
| 10,297,442 B2 | 5/2019 | Varadarajan et al. |
| 10,325,773 B2 | 6/2019 | Varadarajan et al. |
| 10,472,714 B2 | 11/2019 | Varadarajan |
| 10,580,690 B2 | 3/2020 | Yu et al. |
| 2001/0021491 A1 | 9/2001 | Chen et al. |
| 2002/0000202 A1 | 1/2002 | Yuda et al. |
| 2002/0012876 A1 | 1/2002 | Angelopoulos et al. |
| 2002/0016085 A1 | 2/2002 | Huang et al. |
| 2002/0019148 A1 | 2/2002 | Hawryluk et al. |
| 2002/0024117 A1 | 2/2002 | Russell et al. |
| 2002/0039625 A1 | 4/2002 | Powell et al. |
| 2002/0106891 A1 | 8/2002 | Kim et al. |
| 2002/0132101 A1 * | 9/2002 | Fonash ................ G01N 27/121 428/304.4 |
| 2003/0001275 A1 | 1/2003 | Sambucetti et al. |
| 2003/0008528 A1 | 1/2003 | Xia et al. |
| 2003/0036215 A1 | 2/2003 | Reid |
| 2003/0049460 A1 | 3/2003 | O'Neill et al. |
| 2003/0057553 A1 | 3/2003 | DelaRosa et al. |
| 2003/0064154 A1 | 4/2003 | Laxman et al. |
| 2003/0068881 A1 | 4/2003 | Xia et al. |
| 2003/0082296 A1 | 5/2003 | Elers et al. |
| 2003/0089992 A1 | 5/2003 | Rathi et al. |
| 2003/0139035 A1 | 7/2003 | Yim et al. |
| 2003/0154141 A1 | 8/2003 | Capazario et al. |
| 2003/0162033 A1 | 8/2003 | Johnson et al. |

(56) References Cited

U.S. PATENT DOCUMENTS

| | | |
|---|---|---|
| 2003/0176030 A1 | 9/2003 | Tsuji et al. |
| 2003/0194496 A1 | 10/2003 | Xu et al. |
| 2003/0232150 A1 | 12/2003 | Arnold et al. |
| 2003/0232504 A1* | 12/2003 | Eppler ............... H01L 21/0276 438/709 |
| 2003/0232514 A1 | 12/2003 | Kim et al. |
| 2004/0025791 A1 | 2/2004 | Chen et al. |
| 2004/0067308 A1 | 4/2004 | Zheng et al. |
| 2004/0084680 A1 | 5/2004 | Ruelke et al. |
| 2004/0084774 A1 | 5/2004 | Li et al. |
| 2004/0089924 A1 | 5/2004 | Yuasa et al. |
| 2004/0113279 A1 | 6/2004 | Chen et al. |
| 2004/0115876 A1 | 6/2004 | Goundar et al. |
| 2004/0115954 A1 | 6/2004 | Todd |
| 2004/0121085 A1 | 6/2004 | Wang et al. |
| 2004/0124531 A1 | 7/2004 | Venkatraman et al. |
| 2004/0161535 A1 | 8/2004 | Goundar et al. |
| 2004/0178169 A1 | 9/2004 | Desphande et al. |
| 2004/0194706 A1 | 10/2004 | Wang et al. |
| 2004/0207084 A1 | 10/2004 | Hedrick et al. |
| 2004/0232552 A1 | 11/2004 | Wang et al. |
| 2004/0253777 A1 | 12/2004 | Miyoshi et al. |
| 2005/0014361 A1 | 1/2005 | Nguyen et al. |
| 2005/0042889 A1 | 2/2005 | Lee et al. |
| 2005/0100682 A1 | 5/2005 | Fukiage et al. |
| 2005/0202685 A1 | 9/2005 | Huang et al. |
| 2005/0230831 A1 | 10/2005 | Clevenger et al. |
| 2005/0233555 A1 | 10/2005 | Rajagopalan et al. |
| 2005/0236711 A1 | 10/2005 | Wang et al. |
| 2005/0245071 A1 | 11/2005 | Wu et al. |
| 2005/0255714 A1 | 11/2005 | Iyer et al. |
| 2005/0277302 A1 | 12/2005 | Nguyen et al. |
| 2005/0287790 A1 | 12/2005 | Owada et al. |
| 2005/0287811 A1 | 12/2005 | Inukai |
| 2006/0014384 A1 | 1/2006 | Lee et al. |
| 2006/0014399 A1 | 1/2006 | Joe |
| 2006/0019486 A1 | 1/2006 | Yu et al. |
| 2006/0040507 A1 | 2/2006 | Mak et al. |
| 2006/0046520 A1 | 3/2006 | Padhi et al. |
| 2006/0091559 A1 | 5/2006 | Nguyen et al. |
| 2006/0110931 A1 | 5/2006 | Fukazawa et al. |
| 2006/0160376 A1 | 7/2006 | Padhi et al. |
| 2006/0216916 A1 | 9/2006 | Tsai et al. |
| 2006/0252273 A1 | 11/2006 | Lakshmanan et al. |
| 2006/0273319 A1 | 12/2006 | Dairiki et al. |
| 2007/0004204 A1 | 1/2007 | Fukazawa et al. |
| 2007/0032054 A1 | 2/2007 | Ramaswamy et al. |
| 2007/0032095 A1 | 2/2007 | Ramaswamy et al. |
| 2007/0141812 A1 | 6/2007 | Zagwijn et al. |
| 2007/0166546 A1 | 7/2007 | Ichikawa et al. |
| 2007/0173071 A1 | 7/2007 | Afzali-Ardakani et al. |
| 2007/0190266 A1 | 8/2007 | Fu |
| 2007/0225823 A1 | 9/2007 | Hawkins et al. |
| 2007/0232071 A1 | 10/2007 | Balseanu et al. |
| 2007/0264839 A1 | 11/2007 | Van Gompel et al. |
| 2007/0281496 A1 | 12/2007 | Ingle et al. |
| 2007/0281497 A1 | 12/2007 | Liu et al. |
| 2008/0050933 A1 | 2/2008 | Ozaki et al. |
| 2008/0057666 A1 | 3/2008 | Kim |
| 2008/0063809 A1 | 3/2008 | Lee et al. |
| 2008/0064173 A1 | 3/2008 | Hung |
| 2008/0070396 A1 | 3/2008 | Budrevich et al. |
| 2008/0099754 A1 | 5/2008 | Enicks |
| 2008/0122103 A1 | 5/2008 | Bonilla et al. |
| 2008/0128907 A1 | 6/2008 | Yang et al. |
| 2008/0156264 A1 | 7/2008 | Fair et al. |
| 2008/0173984 A1 | 7/2008 | Lin et al. |
| 2008/0178805 A1 | 7/2008 | Paterson et al. |
| 2008/0217746 A1 | 9/2008 | Morita et al. |
| 2008/0233366 A1 | 9/2008 | Edelstein et al. |
| 2008/0254641 A1 | 10/2008 | Kobayashi et al. |
| 2008/0277765 A1 | 11/2008 | Lane et al. |
| 2009/0017227 A1 | 1/2009 | Fu et al. |
| 2009/0017640 A1 | 1/2009 | Huh et al. |
| 2009/0042402 A1 | 2/2009 | Morioka |
| 2009/0082240 A1 | 3/2009 | Nukui et al. |
| 2009/0183984 A1 | 7/2009 | Sakuma et al. |
| 2009/0215282 A1 | 8/2009 | Moore et al. |
| 2009/0218699 A1 | 9/2009 | Torres et al. |
| 2009/0258487 A1 | 10/2009 | Lin et al. |
| 2009/0264277 A1 | 10/2009 | Raj et al. |
| 2009/0294925 A1 | 12/2009 | Lin et al. |
| 2009/0325364 A1 | 12/2009 | Sasagawa et al. |
| 2010/0075077 A1 | 3/2010 | Bicker et al. |
| 2010/0081293 A1 | 4/2010 | Mallick et al. |
| 2010/0144150 A1 | 6/2010 | Sills et al. |
| 2010/0181654 A1 | 7/2010 | Fujiwara et al. |
| 2010/0207274 A1 | 8/2010 | Hayashi et al. |
| 2010/0255667 A1 | 10/2010 | Seino et al. |
| 2010/0308463 A1 | 12/2010 | Yu et al. |
| 2010/0311251 A1 | 12/2010 | Okada et al. |
| 2010/0317198 A1 | 12/2010 | Antonelli et al. |
| 2011/0027957 A1 | 2/2011 | Berry |
| 2011/0045676 A1 | 2/2011 | Park et al. |
| 2011/0074044 A1 | 3/2011 | Lin et al. |
| 2011/0109148 A1 | 5/2011 | Monyak et al. |
| 2011/0111533 A1 | 5/2011 | Varadarajan et al. |
| 2011/0111590 A1 | 5/2011 | Edelstein et al. |
| 2011/0114994 A1 | 5/2011 | Mandlik et al. |
| 2011/0117678 A1 | 5/2011 | Varadarajan et al. |
| 2011/0135557 A1 | 6/2011 | Rangarajan et al. |
| 2011/0146568 A1 | 6/2011 | Haukka et al. |
| 2011/0151678 A1 | 6/2011 | Ashtiani et al. |
| 2011/0180866 A1 | 7/2011 | Matsuda et al. |
| 2011/0193230 A1 | 8/2011 | Nogami et al. |
| 2011/0204492 A1 | 8/2011 | Xie et al. |
| 2011/0236594 A1 | 9/2011 | Haverkamp et al. |
| 2011/0244142 A1 | 10/2011 | Cheng et al. |
| 2012/0009802 A1 | 1/2012 | LaVoie et al. |
| 2012/0077349 A1 | 3/2012 | Li et al. |
| 2012/0122302 A1 | 5/2012 | Weidman et al. |
| 2012/0142172 A1 | 6/2012 | Fox et al. |
| 2012/0202301 A1 | 8/2012 | Yaegashi |
| 2012/0241089 A1 | 9/2012 | Dielmann et al. |
| 2012/0329268 A1 | 12/2012 | Soda et al. |
| 2012/0329287 A1 | 12/2012 | Gates et al. |
| 2013/0008378 A1 | 1/2013 | Antonelli et al. |
| 2013/0043514 A1 | 2/2013 | Grill et al. |
| 2013/0056818 A1 | 3/2013 | Iino et al. |
| 2013/0075455 A1 | 3/2013 | Shimizu |
| 2013/0084711 A1 | 4/2013 | Liang et al. |
| 2013/0119406 A1* | 5/2013 | Notsu ............... H01L 21/02658 |
| 2013/0122686 A1 | 5/2013 | Chang et al. |
| 2013/0129940 A1 | 5/2013 | Xiao et al. |
| 2013/0157466 A1 | 6/2013 | Fox et al. |
| 2013/0242493 A1 | 9/2013 | Shenoy et al. |
| 2013/0298942 A1 | 11/2013 | Ren et al. |
| 2013/0319290 A1 | 12/2013 | Xiao et al. |
| 2013/0330932 A1 | 12/2013 | Rangarajan et al. |
| 2013/0330935 A1 | 12/2013 | Varadarajan |
| 2014/0054534 A1 | 2/2014 | Pellizzer et al. |
| 2014/0094035 A1 | 4/2014 | Ji et al. |
| 2014/0132466 A1 | 5/2014 | Inoue et al. |
| 2014/0170853 A1 | 6/2014 | Shamma et al. |
| 2014/0175617 A1 | 6/2014 | Antonelli et al. |
| 2014/0191365 A1 | 7/2014 | Barabash et al. |
| 2014/0197470 A1 | 7/2014 | Lee et al. |
| 2014/0264780 A1 | 9/2014 | Yim et al. |
| 2014/0264925 A1 | 9/2014 | Chen |
| 2014/0302690 A1 | 10/2014 | Underwood et al. |
| 2014/0356549 A1 | 12/2014 | Varadarajan |
| 2015/0016085 A1 | 1/2015 | Natsumeda et al. |
| 2015/0118394 A1 | 4/2015 | Varadarajan et al. |
| 2015/0179466 A1 | 6/2015 | Takayama et al. |
| 2015/0214015 A1 | 7/2015 | Kikuchi et al. |
| 2015/0303056 A1 | 10/2015 | Varadarajan et al. |
| 2016/0020089 A1 | 1/2016 | Thadani et al. |
| 2016/0090649 A1 | 3/2016 | Varadarajan |
| 2016/0254171 A1 | 9/2016 | Shamma et al. |
| 2016/0268286 A1 | 9/2016 | Tamura |
| 2016/0276140 A1 | 9/2016 | Varadarajan et al. |
| 2016/0284615 A1 | 9/2016 | Kitajima et al. |
| 2016/0314964 A1 | 10/2016 | Tang et al. |
| 2016/0358804 A1 | 12/2016 | Kulshreshtha et al. |

(56) References Cited

U.S. PATENT DOCUMENTS

| | | | |
|---|---|---|---|
| 2017/0140924 A1 | 5/2017 | Suzuki et al. | |
| 2017/0365462 A1 | 12/2017 | Varadarajan et al. | |
| 2018/0033614 A1 | 2/2018 | Chandra et al. | |
| 2018/0096842 A1 | 4/2018 | Varadarajan | |
| 2018/0144977 A1 | 5/2018 | Yu et al. | |
| 2018/0202042 A1 | 7/2018 | Fafard et al. | |
| 2018/0240664 A9 | 8/2018 | Varadarajan et al. | |
| 2018/0330939 A1 | 11/2018 | Pore | |
| 2018/0330945 A1 | 11/2018 | Varadarajan et al. | |
| 2018/0330985 A1 | 11/2018 | Yu et al. | |
| 2018/0347035 A1 | 12/2018 | Weimer et al. | |
| 2019/0181004 A1 | 6/2019 | Tang et al. | |
| 2019/0259604 A1 | 8/2019 | Varadarajan et al. | |
| 2019/0382885 A1 | 12/2019 | Varadarajan et al. | |
| 2020/0027725 A1 | 1/2020 | Weimer et al. | |

FOREIGN PATENT DOCUMENTS

| | | | |
|---|---|---|---|
| CN | 1735945 A | | 2/2006 |
| CN | 101017834 A | | 8/2007 |
| CN | 101017834 A | * | 8/2007 |
| CN | 101065834 A | | 10/2007 |
| CN | 101111930 A | | 1/2008 |
| CN | 101536191 A | | 9/2009 |
| CN | 102171796 A | | 8/2011 |
| CN | 102187450 A | | 9/2011 |
| CN | 102468434 A | | 5/2012 |
| CN | 102652353 A | | 8/2012 |
| CN | 102892922 A | | 1/2013 |
| EP | 1 172 845 A2 | | 1/2002 |
| EP | 1 186 685 A2 | | 3/2002 |
| JP | 10-092742 A | | 4/1998 |
| JP | 2001-160547 | | 6/2001 |
| JP | 2002-176100 | | 6/2002 |
| JP | 2002-217189 | | 8/2002 |
| JP | 2004-247725 | | 9/2004 |
| JP | 2004-320005 A | | 11/2004 |
| JP | 2005-051096 A | | 2/2005 |
| JP | 2007-158000 | | 6/2007 |
| JP | 2008-529296 | | 7/2008 |
| KR | 2006-0029762 | | 4/2006 |
| KR | 10-2006-0134964 | | 12/2006 |
| KR | 2007-0102960 | | 10/2007 |
| KR | 10-2009-0121361 | | 11/2009 |
| KR | 2010-0028050 A | | 3/2010 |
| KR | 2011-0063386 | | 6/2011 |
| KR | 2011-0074904 | | 7/2011 |
| KR | 2011-0099286 A | | 9/2011 |
| KR | 10-1334640 B1 | | 11/2013 |
| TW | 261689 B | | 11/1995 |
| TW | 476807 B | | 2/2002 |
| TW | 535253 B | | 6/2003 |
| TW | 200405437 | | 4/2004 |
| TW | 200600984 | | 1/2006 |
| TW | 200803988 | | 1/2008 |
| TW | 200839884 | | 10/2008 |
| TW | 200903635 A | | 1/2009 |
| TW | 200908138 | | 2/2009 |
| TW | 201123294 A | | 7/2011 |
| TW | 201124553 A | | 7/2011 |
| TW | 201214512 A1 | | 4/2012 |
| TW | 201214563 A | | 4/2012 |
| TW | 201240012 A1 | | 10/2012 |
| TW | 201405659 A | | 2/2014 |
| WO | WO 2007/116492 | | 10/2007 |
| WO | WO 2010/020578 A1 | | 2/2010 |
| WO | WO 2011/109148 A2 | | 9/2011 |

OTHER PUBLICATIONS

U.S. Final Office Action dated May 14, 2015 issued in U.S. Appl. No. 13/907,699.
U.S. Advisory Action and Examiner Initiated Interview Summary dated Aug. 12, 2015 issued in U.S. Appl. No. 13/907,699.
U.S. Notice of Allowance dated Sep. 10, 2015 issued in U.S. Appl. No. 13/907,699.
U.S. Office Action dated Feb. 5, 2018 issued in U.S. Appl. No. 14/961,637.
U.S. Final Office Action dated Aug. 28, 2018 issued in U.S. Appl. No. 14/961,637.
U.S. Office Action dated Jan. 29, 2019 issued in U.S. Appl. No. 14/961,637.
U.S. Office Action dated Sep. 15, 2015 issued in U.S. Appl. No. 14/062,648.
U.S. Notice of Allowance dated Feb. 19, 2016 issued in U.S. Appl. No. 14/062,648.
U.S. Office Action dated Nov. 16, 2018 issued in U.S. Appl. No. 15/169,530.
U.S. Office Action dated Nov. 2, 2015 issued in U.S. Appl. No. 14/616,435.
U.S. Final Office Action dated Mar. 10, 2016 issued in U.S. Appl. No. 14/616,435.
U.S. Office Action dated Jul. 8, 2016 issued in U.S. Appl. No. 14/616,435.
U.S. Final Office Action dated Feb. 22, 2017 issued in U.S. Appl. No. 14/616,435.
U.S. Examiner's Answer to the Appeal brief [filed May 19, 2017] before the Patent Trial and Appeal Board dated Sep. 22, 2017 issued in U.S. Appl. No. 14/616,435.
U.S. Notice of Allowance dated Feb. 4, 2019 issued in U.S. Appl. No. 14/616,435.
U.S. Office Action dated Sep. 12, 2016 issued in U.S. Appl. No. 14/692,627.
U.S. Final Office Action, dated May 19, 2017, issued in U.S. Appl. No. 14/692,627.
U.S. Office Action dated Nov. 8, 2017 issued in U.S. Appl. No. 14/692,627.
U.S. Final Office Action dated May 16, 2018 issued in U.S. Appl. No. 14/692,627.
U.S. Office Action dated Dec. 29, 2017 issued in U.S. Appl. No. 15/283,159.
U.S. Office Action dated Aug. 29, 2018 issued in U.S. Appl. No. 15/283,159.
U.S. Notice of Allowance dated Jan. 7, 2019 issued in U.S. Appl. No. 15/283,159.
U.S. Notice of Allowance dated Feb. 7, 2018 issued in U.S. Appl. No. 15/408,291.
U.S. Office Action dated Jul. 28, 2017 issued in U.S. Appl. No. 15/408,291.
U.S. Office Action dated Jul. 7, 2017 issued in U.S. Appl. No. 15/382,137.
U.S. Notice of Allowance dated Sep. 22, 2017 issued in U.S. Appl. No. 15/382,137.
U.S. Office Action dated Feb. 24, 2005 issued in U.S. Appl. No. 10/670,660.
U.S. Notice of Allowance dated Sep. 11, 2006 issued in U.S. Appl. No. 11/234,808.
U.S. Office Action dated May 3, 2006 issued in U.S. Appl. No. 10/915,117.
U.S. Final Office Action dated Sep. 7, 2006 issued in U.S. Appl. No. 10/915,117.
U.S. Office Action dated Dec. 11, 2006 issued in U.S. Appl. No. 10/915,117.
U.S. Notice of Allowance dated Feb. 26, 2007 issued in U.S. Appl. No. 10/915,117.
U.S. Office Action dated May 1, 2008 issued in U.S. Appl. No. 11/373,847.
U.S. Notice of Allowance and Allowed Claims dated Jul. 1, 2008 issued in U.S. Appl. No. 11/373,847.
U.S. Office Action dated Apr. 10, 2009 issued in U.S. Appl. No. 11/805,356.
U.S. Final Office Action dated Oct. 13, 2009 issued in U.S. Appl. No. 11/805,356.
U.S. Office Action dated Apr. 8, 2010 issued in U.S. Appl. No. 11/805,356.
U.S. Notice of Allowance and Allowed Claims dated Jul. 26, 2010 issued in U.S. Appl. No. 11/805,356.

(56) References Cited

OTHER PUBLICATIONS

U.S. Office Action dated Sep. 6, 2006 issued in U.S. Appl. No. 10/869,474.
U.S. Office Action dated Feb. 9, 2007 issued in U.S. Appl. No. 10/869,474.
U.S. Final Office Action dated Jun. 28, 2007 issued in U.S. Appl. No. 10/869,474.
U.S. Notice of Allowance dated Jul. 26, 2007 issued in U.S. Appl. No. 10/869,474.
U.S. Office Action dated Mar. 17, 2008 issued in U.S. Appl. No. 11/893,490.
U.S. Office Action dated Aug. 8, 2008 issued in U.S. Appl. No. 11/893,490.
U.S. Office Action (Ex Parte Quayle) dated Jan. 27, 2009 issued in U.S. Appl. No. 11/893,490.
U.S. Notice of Allowance dated May 4, 2009 issued in U.S. Appl. No. 11/893,490.
U.S. Office Action dated Oct. 15, 2010 issued in U.S. Appl. No. 12/497,322.
U.S. Notice of Allowance and Allowed Claims dated Mar. 11, 2011 issued in U.S. Appl. No. 12/497,322.
U.S. Office Action dated Nov. 20, 2009 issued in U.S. Appl. No. 11/710,652.
U.S. Final Office Action dated Apr. 15, 2010 issued in U.S. Appl. No. 11/710,652.
U.S. Office Action dated Aug. 5, 2010 issued in U.S. Appl. No. 11/710,652.
U.S. Notice of Allowance and Allowed Claims dated Nov. 24, 2010 issued in U.S. Appl. No. 11/710,652.
U.S. Office Action dated Jul. 9, 2013 issued in U.S. Appl. No. 11/710,652.
U.S. Notice of Allowance dated Oct. 25, 2013 issued in U.S. Appl. No. 11/710,652.
U.S. Office Action dated Dec. 31, 2008 issued in U.S. Appl. No. 11/693,617.
U.S. Office Action dated Oct. 7, 2009 issued in U.S. Appl. No. 11/693,617.
U.S. Office Action dated Jun. 10, 2010 issued in U.S. Appl. No. 11/693,617.
U.S. Final Office Action dated Jan. 20, 2011 issued in U.S. Appl. No. 11/693,617.
U.S. Office Action dated Sep. 16, 2011 issued in U.S. Appl. No. 11/693,617.
U.S. Notice of Allowance dated Jan. 9, 2012 issued in U.S. Appl. No. 11/693,617.
U.S. Office Action dated Jan. 12, 2011 issued in U.S. Appl. No. 12/082,496.
U.S. Final Office Action dated Aug. 4, 2011 issued in U.S. Appl. No. 12/082,496.
U.S. Notice of Allowance dated Oct. 26, 2011 issued in U.S. Appl. No. 12/082,496.
U.S. Notice of Allowance dated Apr. 10, 2012 issued in U.S. Appl. No. 12/631,691.
U.S. Office Action dated Feb. 7, 2014 issued in U.S. Appl. No. 13/967,832.
U.S. Notice of Allowance dated May 30, 2014 issued in U.S. Appl. No. 13/967,832.
U.S. Notice of Allowance dated Sep. 5, 2014 issued in U.S. Appl. No. 13/967,832.
U.S. Office Action dated Sep. 29, 2015 issued in U.S. Appl. No. 14/105,026.
U.S. Notice of Allowance dated Jan. 29, 2016 issued in U.S. Appl. No. 14/105,026.
U.S. Office Action dated Feb. 7, 2014 issued in U.S. Appl. No. 13/494,836.
U.S. Final Office Action dated Aug. 21, 2014 issued in U.S. Appl. No. 13/494,836.
U.S. Office Action dated May 5, 2015 issued in U.S. Appl. No. 13/494,836.
U.S. Final Office Action dated Nov. 16, 2015 issued in U.S. Appl. No. 13/494,836.
U.S. Office Action dated Mar. 10, 2016 issued in U.S. Appl. No. 13/494,836.
U.S. Final Office Action dated Jul. 11, 2016 issued in U.S. Appl. No. 13/494,836.
U.S. Office Action dated Jan. 9, 2017 issued in U.S. Appl. No. 13/494,836.
U.S. Examiner's Answer to the Appeal brief [filed Apr. 28, 2017] before the Patent Trial and Appeal Board dated Sep. 25, 2017 issued in U.S. Appl. No. 13/494,836.
U.S. Notice of Allowance dated Oct. 2, 2018 issued in U.S. Appl. No. 13/494,836.
U.S. Office Action dated Jan. 28, 2019 issued in U.S. Appl. No. 15/969,045.
Taiwan Office Action dated Nov. 6, 2017 issued in Application No. TW 103119100.
Taiwan Notice of Allowance dated Jan. 8, 2019 issued in Application No. TW 107126975.
Singapore Notice of Allowance & Supplemental Exam Report dated Nov. 30, 2017 issued in Application No. SG 10201402381U.
Chinese First Office Action dated Sep. 5, 2016 issued in Application No. CN 201410576747.1.
Chinese First Office Action dated Dec. 20, 2018 issued in Application No. CN 201710307116.3.
Taiwan Notice of Allowance and Search Report dated Jun. 14, 2018 issued in Application No. TW 103136697.
Taiwan First Office Action dated Dec. 24, 2018 issued in Application No. TW 107123391.
Chinese First Office Action dated Jan. 3, 2018 issued in Application No. CN 201610084166.5.
Chinese Second Office Action dated Oct. 12, 2018 issued in Application No. CN 201610084166.5.
Chinese First Office Action dated Jun. 25, 2018 issued in Application No. CN 201610251266.2.
Chinese Second Office Action [Decision of Final Rejection] dated Jan. 25, 2019 issued in Application No. CN 201610251266.2.
Chinese First Office Action dated Jan. 24, 2014 issued in Application No. CN 201010569747.0.
Chinese Second Office Action dated Aug. 14, 2014 issued in Application No. CN 201010569747.0.
Chinese Third Office Action dated Jan. 13, 2015 issued in Application No. CN 201010569747.0.
Chinese First Office Action dated Jul. 3, 2017 issued in Application No. CN 201510566292.X.
Japanese Office Action dated Jul. 29, 2014 issued in Application No. JP 2010-256165.
Korean Office Action dated Feb. 20, 2017 issued in Application No. KR 10-2010-0123145.
Korean First Office Action dated Feb. 1, 2018 issued in Application No. KR 10-2017-0147917.
Taiwan Notice of Allowance and Search Report dated Jul. 8, 2015 issued in Application No. TW 099140866.
Taiwan Office Action dated Jan. 14, 2016 issued in Application No. TW 104126278.
Taiwan Examination Report dated Mar. 14, 2017 issued in Application No. TW 102146997.
Taiwan Examination Report dated Aug. 8, 2017 issued in Application No. TW 102146997.
Taiwan Office Action dated Dec. 22, 2015 issued in Application No. TW 102120742.
Benilan et al., (Oct. 4, 2011) "Optimization of microwave Hydrogen plasma discharges to mimic Lyman α(121.6 nm) solar irradiations," *EPSC-DPS2011-131 7, EPSC-DPJ Joint Meeting 2011, EPSC Abstracts*, 6:2pp.
Blaszczyk-Lezak et al., (2005) "Silicon Carbonitride Films Produced by Remote Hydrogen Microwave Plasma CVD Using a (Dimethylamino)dimethylsilane Precursor," *Chemical Vapor Deposition*, 11(1):44-52.
"Development of Current Atomic Theory," Emission Spectrum of Hydrogen, [downloaded at http://chemed.chem.purdue.edu/genchem/topicreview/bp/ch6/bohr.html on Sep. 23, 2015], 7pp.

(56) References Cited

OTHER PUBLICATIONS

"Dummies' Guide to Hydrogen," Molecular Hydrogen Foundation, MHF, [downloaded at http://www.molecularhydrogenfoundation.org/core-information/dummies-guide-to-hydrogen on Sep. 23, 2015], 2 pp.

Fozza et al., (Jan./Feb. 1998) "Vacuum ultraviolet to visible emission of some pure gases and their mixtures used for plasma processing," *J. Vac. Sci. Technol. A, American Vacuum Society*, 16(1):72-77.

Grubbs et al. (May/Jun. 2006) "Attenuation of hydrogen radicals traveling under flowing gas conditions through tubes of different materials," *J. Vac. Sci. Technol. A*, 24(3):486-496.

Hatanaka et al., (2000) "Experiments and analyses of SiC thin film deposition from organo-silicon by a remote plasma method," *Thin Solid Films*, 368:287-291.

Huran, J., et al., (2004) "RBS study of amorphous silicon carbide films deposited by PECVD," *Czechoslovak Journal of Physics*, 54(Suppl. C):C1006-C1010.

Jones et al., (Nov. 30, 2001) "Silicon Containing Polymers: The Science and Technology of Their Synthesis and Applications," *Springer*, p. 705.

Lemaire, P.J., Walker, K.L., Kranz, K.S., Huff, R.G. and DiMarcello, F.V., (1990) "Diffusion of Hydrogen Through Hermetic Carbon Films on Silica Fibers," AT&T Bell Laboratories, 600 Mountain Avenue, Murray Hill, NJ 07974, *Mat. Res. Soc. Symp. Proc.* vol. 172, 12 pages, © 1990 Materials Research Society.

Maeda et al. (Sep. 1989), "A Low-Permittivity Interconnection Using an SiBN Interlayer," *IEEE Transactions on Electron Devices* 36(9).

"Radical (chemistry)" From Wikipedia, the free encyclopedia, [downloaded at http://en.wikipedia.org/wiki/Radical_(chemistry) on Sep. 23, 2015), 11 pages.

Sugino, Takashi et al. (2001), "Synthesis of boron nitride film with low dielectric constant for its application to silicon ultralarge scale integrated semiconductors," *Diamond and Related Materials*, pp. 1275-1379, Elsevier Science B.V.

Wrobel et al. (2001) "Oligomerization and Polymerization Steps in Remote Plasma Chemical Vapor Deposition of Silicon-Carbon and Silica Films from Organosilicon Sources," *Chem. Mater*, 13(5): 1884-1895.

Wróbel et al., (2010) "Reactivity of Organosilicon Precursors in Remote Hydrogen Microwave Plasma Chemical Vapor Deposition of Silicon Carbide and Silicon Carbonitride Thin-Film Coatings," *Appl. Organometal. Chem.*, 24:201-207.

Wu et al. (Oct. 17-19, 2006), "Ultra Low k Dielectrics Prepared by PECVD Using a Single-Precursor and Treated by UV Assisted Thermal Processing," *Advanced Metallization Conference (AMC)* 2006, pp. 1-6, San Diego, CA.

Xu, Ying-Yu, et al., (1999) "Preparation of SiC Thin Film Using Organosilicon by Remote Plasma Cvd Method," *Mat. Res. Soc. Symp. Proc.*, 544:185-189.

U.S. Notice of Allowance, dated Jan. 9, 2015, issued in U.S. Appl. No. 13/896,729.

U.S. Notice of Allowance (Corrected Notice of Allowability), dated Apr. 24, 2015, issued in U.S. Appl. No. 13/896,729.

U.S. Office Action, dated Aug. 4, 2015, issued in U.S. Appl. No. 14/101,901.

U.S. Final Office Action, dated Nov. 25, 2015, issued in U.S. Appl. No. 14/101,901.

U.S. Notice of Allowance, dated Feb. 10, 2016, issued in U.S. Appl. No. 14/101,901.

U.S. Office Action, dated Aug. 10, 2018, issued in U.S. Appl. No. 15/150,239.

U.S. Notice of Allowance, dated Nov. 26, 2018, issued in U.S. Appl. No. 15/150,239.

Taiwan Notice of Allowance and Search Report dated Jul. 13, 2017 issued in Application No. TW 102117769.

Taiwan Examination Report dated Feb. 9, 2017 issued in Application No. TW 102146185.

U.S. Appl. No. 11/693,661, filed Mar. 29, 2007, Wu et al.

U.S. Appl. No. 16/041,153, filed Jul. 20, 2018, Weimer et al.

U.S. Appl. No. 16/240,133, filed Jan. 4, 2019, Varadarajan.

U.S. Final Office Action dated Nov. 5, 2010 issued in U.S. Appl. No. 11/693,661.

U.S. Office Action dated Aug. 28, 2009 issued in U.S. Appl. No. 11/693,661.

U.S. Office Action dated Feb. 24, 2010 issued in U.S. Appl. No. 11/693,661.

U.S. Notice of Allowance dated Jun. 18, 2019 issued in U.S. Appl. No. 14/961,637.

U.S. Final Office Action dated Mar. 5, 2019 issued in U.S. Appl. No. 15/169,530.

U.S. Office Action dated Dec. 2, 2019 issued in U.S. Appl. No. 15/169,530.

U.S. Office Action dated Apr. 18, 2019 issued in U.S. Appl. No. 15/972,554.

U.S. Notice of Allowance dated Oct. 22, 2019 issued in U.S. Appl. No. 15/972,554.

U.S. Final Office Action dated Aug. 6, 2019 issued in U.S. Appl. No. 15/969,045.

Chinese Second Office Action dated Jun. 3, 2019 issued in Application No. CN 201710307116.3.

Chinese Third Office Action dated Dec. 9, 2019 issued in Application No. CN 201710307116.3.

Chinese Third Office Action dated Apr. 22, 2019 issued in Application No. CN 201610084166.5.

PCT International Search Report and Written Opinion (ISA/KR) dated Dec. 26, 2017 issued in PCT/US2017/051794.

PCT International Preliminary Report on Patentability dated Apr. 11, 2019 (ISA/KR) dated Apr. 11, 2019 issued in PCT/US2017/051794.

PCT International Search Report and Written Opinion (ISA/KR) dated Mar. 15, 2018 issued in PCT/US2017/062882.

PCT International Preliminary Report on Patentability (ISA/KR) dated Jun. 6, 2019 issued in PCT/US2017/062882.

PCT International Search Report and Written Opinion (ISA/KR) dated Mar. 19, 2018 issued in PCT/US2017/064024.

PCT International Preliminary Report on Patentability (ISA/KR) dated Jun. 27, 2019 issued in PCT/US2017/064024.

Korean First Office Action dated Aug. 9, 2019 issued in Application No. KR 10-2013-0066728.

Korean Decision for Grant of Patent dated Dec. 27, 2019 issued in Application No. KR 10-2013-0066728.

Taiwanese Second Office Action dated Apr. 18, 2019 issued in Application No. TW 107123391.

Taiwanese Third Office Action dated Aug. 21, 2019 issued in Application No. TW 107123391.

Taiwanese First Office Action dated Jul. 31, 2019 issued in Application No. TW 105103396.

PCT International Search Report and Written Opinion (ISA/KR) dated Nov. 8, 2019 issued in Application No. PCT/US2019/042821.

International Search Report and Written Opinion dated Nov. 20, 2019 (ISA/KR) issued in PCT/US2019/042812.

International Search Report and Written Opinion dated Oct. 25, 2019 issued in Application No. PCT/US2019/042413.

Boo et al., (1999) "Growth of boron nitride thin films on silicon substrates using new organoboron precursors" Phys. Stat. sol. (a), vol. 176. Nov. 1999, pp. 705-710.

G.E. Coates et al., "Chapter Four: Organometallic compounds of elements of main groups IV and V," Principles of Organometallic Chemistry, (1968) pp. 121-122.

Sota et al., (2010) "Influence of atomic bonds on electrical property of boron carbon nitride films synthesized by remote plasma-assisted chemical vapor deposition. Diamond & Related Materials" vol. 19, No. 12, Jun. 23, 2010, pp. 1441-1445.

Fozza et al., (Jul. 2000) "Vacuum ultraviolet to visible emission from hydrogen plasma: Effect of excitation frequency," Journal of Applied Physics, 88(1):20-33.

Holländer et al., (May 1994) "Vacuum ultraviolet emission from microwave plasmas of hydrogen and its mixtures with helium and oxygen," J. Vac. Sci. Technol. A, 12(3):879 -882.

Korean First Office Action dated Sep. 25, 2019 issued in Application No. KR 10-2013-0056017.

(56) References Cited

OTHER PUBLICATIONS

U.S. Appl. No. 16/556,145, filed Aug. 29, 2019, Varadarajan.
U.S. Office Action dated Jul. 9, 2019 issued in U.S. Appl. No. 16/041,153.
U.S. Final Office Action dated Dec. 12, 2019 issued in U.S. Appl. No. 16/041,153.
U.S. Office Action dated Mar. 6, 2020 issued in U.S. Appl. No. 15/696,045.
U.S. Final Office Action dated Apr. 10, 2020 issued in U.S. Appl. No. 15/169,530.
U.S. Office Action dated Mar. 19, 2020 issued in U.S. Appl. No. 16/194,102.
U.S. Notice of Allowance dated Mar. 25, 2020 issued in U.S. Appl. No. 16/041,153.
Korean Second Office Action dated Feb. 24, 2020 issued in Application No. KR 10-2013-0056017.
Korean First Office Action dated Jan. 30, 2020 issued in Application No. KR 2013-0158829.
Chinese Examination Decision dated Apr. 8, 2020 issued in Application No. 201610251266.2.

* cited by examiner

310

320

GAP FILL USING CARBON-BASED FILMS

CROSS-REFERENCE TO RELATED APPLICATION

This application is a continuation of and claims priority to U.S. application Ser. No. 14/692,627, titled "GAP FILL USING CARBON-BASED FILMS," filed Apr. 21, 2015, all of which is incorporated herein by this reference and for all purposes.

BACKGROUND

Semiconductor integration operations may involve filling high aspect ratio gaps with insulating material. This is the case for shallow trench isolation, inter-metal dielectric layers, passivation layers, and the like. As device geometries shrink and thermal budgets are reduced, void-free filling of high aspect ratio (AR) gaps becomes increasingly difficult due to limitations of existing deposition processes.

Most deposition methods deposit more material on the upper region than on the lower region of a gap sidewall and may form "top-hats" at the entry of the gap. As a result, the top part of a high aspect ratio structure sometimes closes prematurely leaving voids within the gap's lower portions. This problem is exacerbated in small gaps. Furthermore, as aspect ratios increase, the shape of the gap itself can contribute to the problem. High aspect ratio gaps often exhibit reentrant features, which make gap filling even more difficult. A reentrant feature is a feature that narrows from the bottom of the gap. One such problematic reentrant feature is a narrowing at the top of the gap, with the gap sidewalls sloping inward near the top of the gap. For a given aspect ratio feature, this increases the ratio of gap volume to gap access area seen by the reactor species during deposition. Voids and seams formation is more likely under these conditions. If the top of the gap prematurely closes off, the gap is re-opened before more film can be deposited in the gap.

SUMMARY

Provided herein are methods and apparatuses for gap fill with carbon-based films such as amorphous carbon and silicon carbides. In some embodiments, the methods involve introducing a process gas to a high density plasma chemical vapor deposition (HDP CVD) chamber that houses a substrate having a gap, where the process gas includes a hydrocarbon reactant and has a H:C ratio of at least 4:1, and filling the gap with a carbon-based film by an HDP CVD reaction of the process gas.

In some embodiments, the gap is filled in a single deposition operation without intervening etch operations. In some embodiments, the gap is filled using two or more deposition operations and one or more intervening etch operations. An intervening etch operation may be performed in the HDP CVD chamber or in a separate etch chamber. In some embodiments, an intervening etch operation is a hydrogen-based etch.

In some embodiments, the carbon-based film is an amorphous carbon film. In such cases, the process gas may include the hydrocarbon reactant and an optional carrier gas. The process gas may consist essentially of the hydrocarbon reactant and an optional carrier gas. The process gas may consist essentially of the hydrocarbon reactant, molecular hydrogen or other hydrogen source, and an optional carrier gas. One or more dopants may also be present in the process gas.

In some embodiments, the carbon-based film is an amorphous carbide film. Examples include oxygen doped SiC, also known as silicon oxycarbide (SiOC), nitrogen doped SiC, also known as silicon nitricarbide (SiNC), oxygen and nitrogen doped SiC, also known as silicon oxynitricarbide (SiONC), boron doped carbide (SiBC), and undoped silicon carbide (SiC). In some embodiments, the process gas includes a silicon-containing reactant. The silicon-containing reactant may have an H:Si ration of at least 4. In some cases, the process gas may include the hydrocarbon reactant, a silicon-containing reactant and an optional carrier gas. The process gas may consist essentially of the hydrocarbon reactant, the silicon-containing reactant and an optional carrier gas. The process gas may consist essentially of the hydrocarbon reactant, the silicon-containing reactant, molecular hydrogen or other hydrogen source, and an optional carrier gas. One or more dopants may also be present in the process gas.

In some embodiments, the hydrocarbon reactant has an H:C ratio of at least 3:1 or at least 4:1. Examples include methane ($CH_4$). In some embodiments, the process gas includes molecular hydrogen ($H_2$). The method may include generating hydrogen radicals. In some embodiments, filling the gap includes a hydrogen radical etch during the HDP CVD reaction. Hydrogen radicals may etch deposited carbon-based material at the top of the gap preferentially.

In some embodiments, an apparatus include a plasma generator, a chamber having a pedestal, one or more inlets to the chamber, and a controller including machine-readable instructions for inletting a process gas including a process gas comprising a hydrocarbon reactant, wherein the process gas has a H:C ratio of at least 4:1 and generating a high density plasma in the chamber to thereby fill a gap on a substrate in the chamber.

These and other aspects are described further below with reference to the drawings.

DETAILED DESCRIPTION

Semiconductor integration operations may involve filling high aspect ratio gaps with various materials. This is the case for shallow trench isolation, inter-metal dielectric layers, passivation layers, and the like. As device geometries shrink and thermal budgets are reduced, void-free filling of high aspect ratio (AR) gaps becomes increasingly difficult due to limitations of existing deposition processes.

Provided herein are methods of filling gaps using high density plasma chemical vapor deposition (HDP CVD). According to various implementations, carbon-containing films such as amorphous carbon and amorphous carbide films are deposited by HDP CVD into gaps on substrates to fill the gaps. The methods may involve using high hydrogen-content process gasses during HDP CVD deposition to provide bottom-up fill. Also provided are related apparatus.

Most deposition methods deposit more material on the upper region than on the lower region of a gap sidewall and may form "top-hats" at the entry of the gap. As a result, the top part of a high aspect ratio structure sometimes closes prematurely leaving voids within the gap's lower portions. This problem is exacerbated in small gaps. Furthermore, as aspect ratios increase, the shape of the gap itself can contribute to the problem. High aspect ratio gaps often exhibit reentrant features, which make gap filling even more difficult. A reentrant feature is a feature that narrows from the bottom of the gap. One such problematic reentrant feature is a narrowing at the top of the gap, with the gap sidewalls sloping inward near the top of the gap. For a given aspect ratio feature, this increases the ratio of gap volume to gap access area seen by the precursor species during deposition. Voids and seams formation is more likely under these conditions. If the top of the gap prematurely closes off, the gap is re-opened before more film can be deposited in the gap.

HDP CVD is a directional CVD process that involves directing charged dielectric precursor species toward a substrate. Although HDP CVD is not purely an isotropic, diffusion-based process, some overhang or top-hat formation may still result at the entry region of the gap to be filled. This may result from the non-directional deposition reactions of neutral species in the plasma reactor and from sputtering and redeposition processes. The directional aspect of the deposition process produces some high momentum charged species that sputter away bottom fill. The sputtered material tends to redeposit on the sidewalls. Limitations due to overhang formation become ever more severe as the width of the gap to be filled decreases and the aspect ratio increases. According to various embodiments, the methods provided herein provide gap fill by suppressing re-entrant feature formation using a hydrogen-rich process gas.

Figure 8:
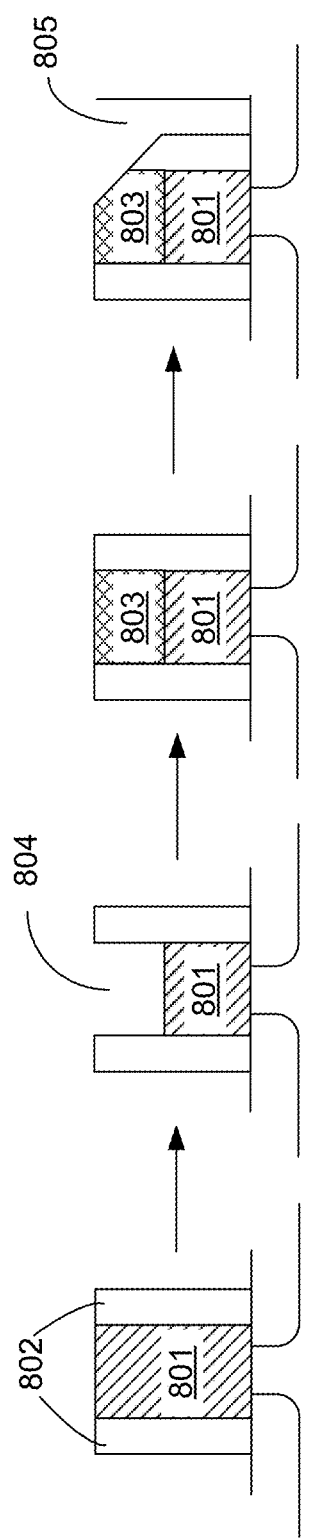
FIG. 8 provides an example of operations including carbon-based gap fill in a self-aligned contact integration process.

In embodiments of the methods provided herein, a gap is filled with an amorphous carbon-containing material such as amorphous carbon (a-C) and amorphous carbides including amorphous silicon carbides (a-SiC). Classes of SiC include oxygen doped SiC, also known as silicon oxycarbide (SiOC), nitrogen doped SiC, also known as silicon nitricarbide (SiNC), oxygen and nitrogen doped SiC, also known as silicon oxynitricarbide (SiONC), boron doped carbide (SiBC), and undoped silicon carbide (SiC). For example, a trench on a topological substrate may be filled with an a-C film that acts as a sacrificial hardmask in a pattern transfer scheme. a-SiC and other amorphous carbide layers may be used, for example, as barrier layers in VLSI backend processes. In some integration schemes, void-free gap fill of SiC or other carbide films is useful. FIG. 8 provides an example of operations including carbon-based gap fill in a self-aligned contact integration process. A metal gate 801 and spacers 802 are depicted in FIG. 8. The metal gate 801 is recessed, forming a gap 804 between the spacers. A gate cap 803, which may be for example a SiC film, is deposited in the gap 804 prior to definition of the contact holes. The presence of the gate cap 803 relaxes the alignment precision for contact hole definition; in FIG. 8, contact hole 805 is within the increased tolerance provided by the gate cap 803.

Figure 1:
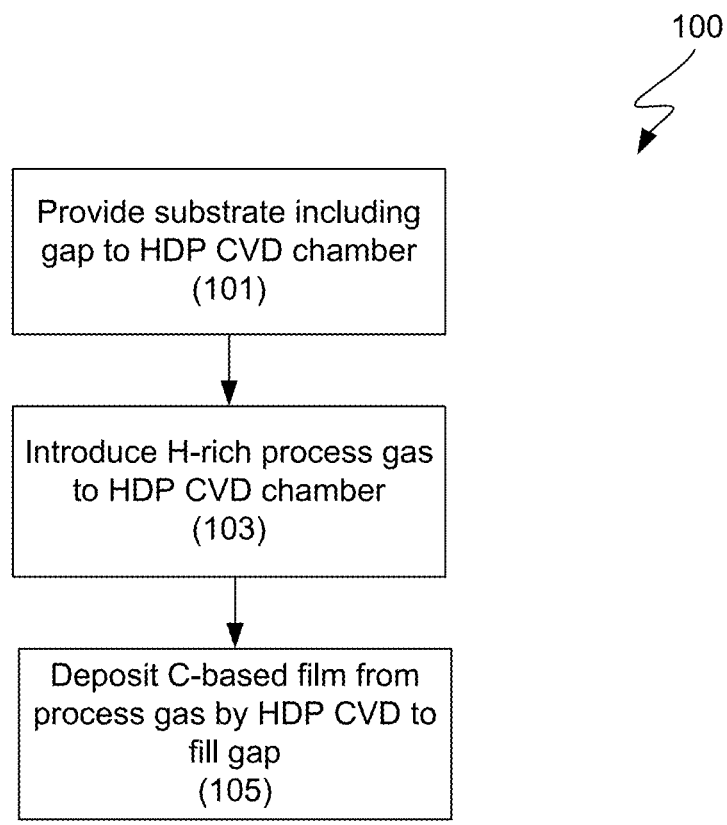
FIG. 1 provides a process flow diagram illustrating operations in an example of a method of filling a gap according to various embodiments.

FIG. 1 provides a process flow diagram illustrating operations in an example of a method of filling a gap according to various embodiments. The process 100 involves providing a substrate including a gap to a HDP CVD chamber. Block 101. HDP CVD chambers are discussed further below with respect to FIG. 6. The substrate may be a wafer suitable for semiconductor processing, such as a 200 mm, 300 mm or 450 mm silicon wafer. Wafers of different compositions and/or sizes may be used. Further, the methods are not limited to semiconductor substrates, but may be implemented with any appropriate substrate that includes a gap to be filled, including glass and plastic panels and the like.

A hydrogen (H)-rich process gas is introduced to the HDP CVD chamber. Block 103. According to various embodiments, block 103 can involve one or both of using H-rich reactants and introducing hydrogen ($H_2$) to the chamber in addition to reactants. The term process gas is used to denote multiple component gases or a mixture thereof that is introduced to the chamber. In some embodiments, a process gas can include a liquid reactant entrained in a carrier gas or otherwise provided to the chamber. The process gas includes one or more carbon reactants to supply carbon to the carbon-based gap fill material, and as appropriate one or more co-reactants such as silicon-containing compounds, nitrogen-containing compounds, boron-containing compounds, and the like.

According to various embodiments, an H-rich process gas may be characterized by one or more of the following: an H:C ratio of at least 3:1, an H:C ratio of more than 3:1, or at H:C ratio of at least 4:1. In some embodiments, a carbon precursor having an H:C ratio of at least 3:1, an H:C ratio of more than 3:1, or at H:C ratio of at least 4:1 is used. Examples include ethane ($C_2H_6$) and methane ($CH_4$). Carbon precursors that have lower H:C ratios may be used with the addition of $H_2$ or hydrogen from another source. For example, a process gas may include acetylene ($C_2H_2$) and $H_2$. A process gas may include an inert carrier gas, with examples including helium (He), argon (Ar), and the like.

As noted above, a process gas may include one or more additional reactants depending on the type of film being deposited. For silicon carbides including SiC, SiCN, SiBC, etc., a silicon-containing reactant such as one or more silanes may be used as a silicon source. Often, the silicon-containing reactant does not include carbon. Non-limiting examples of silanes include silane, disilane, trisilane, and higher silanes.

Other silicon-containing reactants may be used as appropriate, including siloxanes, alkyl silanes, alkoxy silanes, and amino silanes, among others. Non-limiting examples of alkyl silanes include dimethylsilane, trimethylsilane, tetramethylsilane, triethylsilane, and pentamethyldisilamethane. Silicon-carbon-containing films also including oxygen atoms (e.g., silicon-carbon-oxides and silicon-carbon-oxynitrides) may be formed using an organosilicon reactant that includes oxygen, such as siloxanes and alkoxy silanes. Non-limiting examples of siloxanes include cyclotetrasiloxanes (e.g., 2,4,6,8-tetramethylcyclotetrasiloxane; octamethylcyclotetrasiloxane; and heptamethylcyclotetrasiloxane); other cyclic siloxanes; siloxanes having three-dimensional or caged structures (i.e., where silicon atoms are bridged with one another via oxygen atoms, forming a three-dimensional structure or a polyhedron) such as silsequioxane; and linear siloxanes, such as disiloxanes (e.g., pentamethyldisiloxane, tetramethyldisiloxane, and hexamethyl trisiloxane). Non-limiting examples of alkoxy silanes include methoxysilane, dimethoxysilane, trimethoxysilane, methyldimethoxysilane, diethoxymethylsilane, dimethylethoxysilane, and dimethylmethoxysilane. Silicon-carbon-containing films also including nitrogen atoms (e.g., silicon-carbon-nitrides and silicon-carbon-oxynitrides) may be formed using an organosilicon reactant that includes nitrogen, such as amino silanes and silazanes. Non-limiting examples of amino silanes include 2,2-bis(dimethylamino)-4,4-dimethyl-2,4-disilapentane, 2,2,4-trimethyl-4-dimethyl-amino-3,4-disilapentane, dimethylaminodimethylsilane, bis(dimethylamino)methylsilane, and tris(dimethylamino)silane. 1,1,3,3-tetramethyldisilazane is a non-limiting example of a silazane.

According to various embodiments, a silicon-containing reactant and a hydrocarbon may be provided to the chamber in an approximately 1:1 ratio to fill the gap. This includes ratios between 1:1.5 and 1.5:1. In some cases, the ratio is between 1:1.25 and 1.25:1, or between 1:1.1 and 1.1:1. In some embodiments, the silicon-containing reactant is hydrogen rich, having a H:Si ratio of at least 3:1 or at least 4:1.

Non-limiting examples of hydrogen-rich process gases for depositing a-C films include $He/CH_4$, $He/C_2H_2/H_2$, $He/CH_4/H_2$, and $He/C_2H_6/H_2$. Non-limiting examples of hydrogen-rich process gases for depositing a-SiC films include $He/SiH_4/CH_4$, $He/SiH_4/C_2H_2/H_2$, $He/SiH_4/CH_4/H_2$, and $He/SiH4/C2H6/H_2$. Any appropriate carrier gas may be used in addition to or instead of He in these examples. Similarly, any appropriate silicon-containing reactant may be used instead or in addition to $SiH_4$ in these examples.

A carbon-based film is then deposited to fill the gap. Block 105. According to various embodiments, filling the gap may be performed in a single deposition or in multiple depositions separated by intervening an etch operation. An example of the latter technique is described below with respect to FIG. 5.

Figure 2:
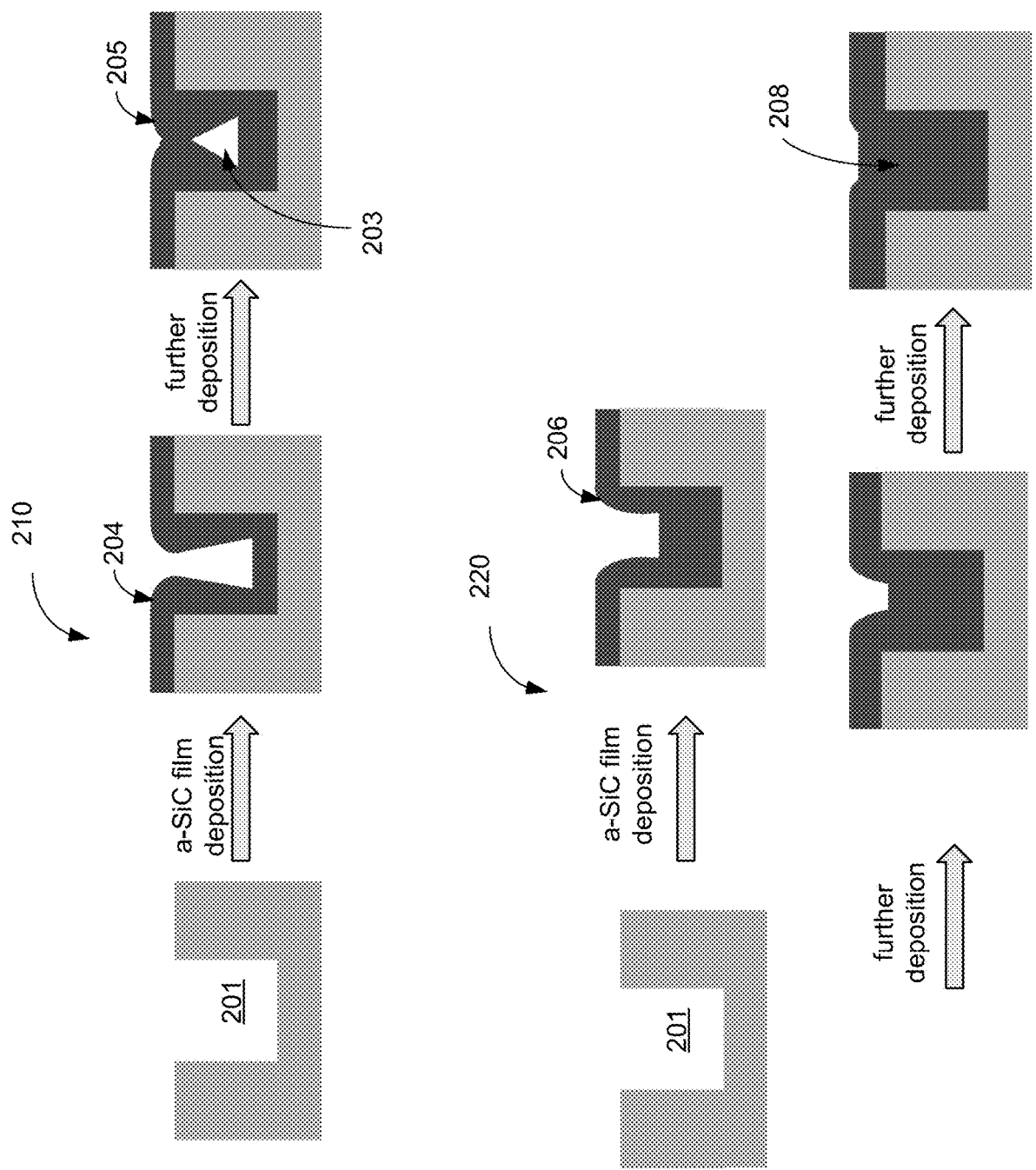
FIG. 2 depicts schematic cross-sectional diagrams of feature filled with SiC in a single deposition stage using acetylene as a carbon source (process gas He/$SiH_4$/$C_2H_2$) as compared to single stage feature fill using methane as a carbon source (process gas He/$SiH_4$/$CH_4$).
Figure 3:
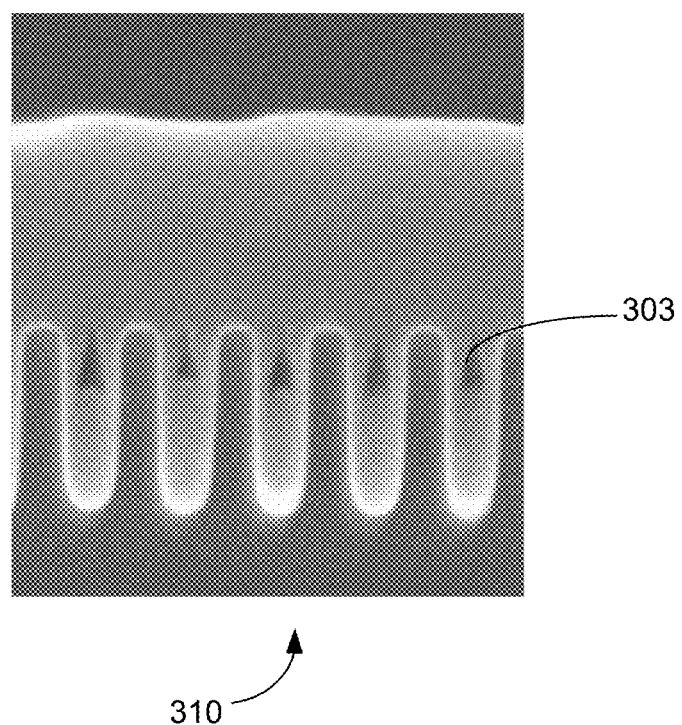
FIG. 3 shows SEM images of 3:1 AR, 25 nm wide trenches filled with SiC using acetylene and methane, respectively, as a carbon source in HDP CVD processes similar to those depicted schematically in FIG. 2.
Figure 3:
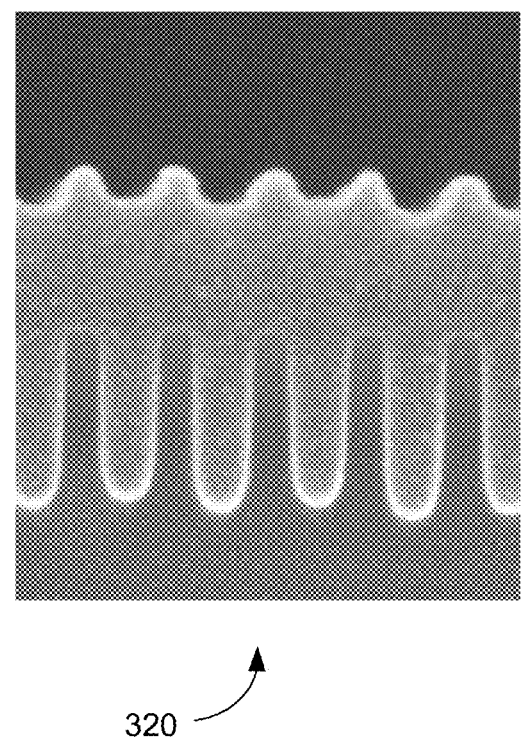

By using a hydrogen-rich carbon precursor in a HDP CVD deposition, bottom-up gap fill may be provided. This is schematically represented in FIG. 2, which depicts cross-sectional diagrams of a feature filled with SiC in a single deposition stage using acetylene as a carbon source (process gas $He/SiH_4/C_2H_2$) as compared to single stage feature fill using methane as a carbon source ($He/SiH_4/CH_4$). Process 210 depicts trench 201 during SiC deposition from $He/SiH_4/C_2H_2$. As the deposition proceeds, a cusp 204 forms. This leads to the closing off of the top 205 of the trench 201, which in turn results in a void 203. In comparison, process 220 using a $He/SiH_4/CH_4$ process gas results in bottom-up fill without void formation. As the deposition progresses, a cusp is suppressed at 206, allowing the trench to remain open and providing void-free fill. FIG. 3 shows SEM images of 3:1 AR, 25 nm wide trenches filled with SiC using acetylene (image 310) and methane (image 320), respectively, as carbon sources in HDP CVD processes similar to those depicted schematically in FIG. 2. Voids 303 can be seen in image 310. By contrast, the trenches filled using methane are void-free.

Figure 4:
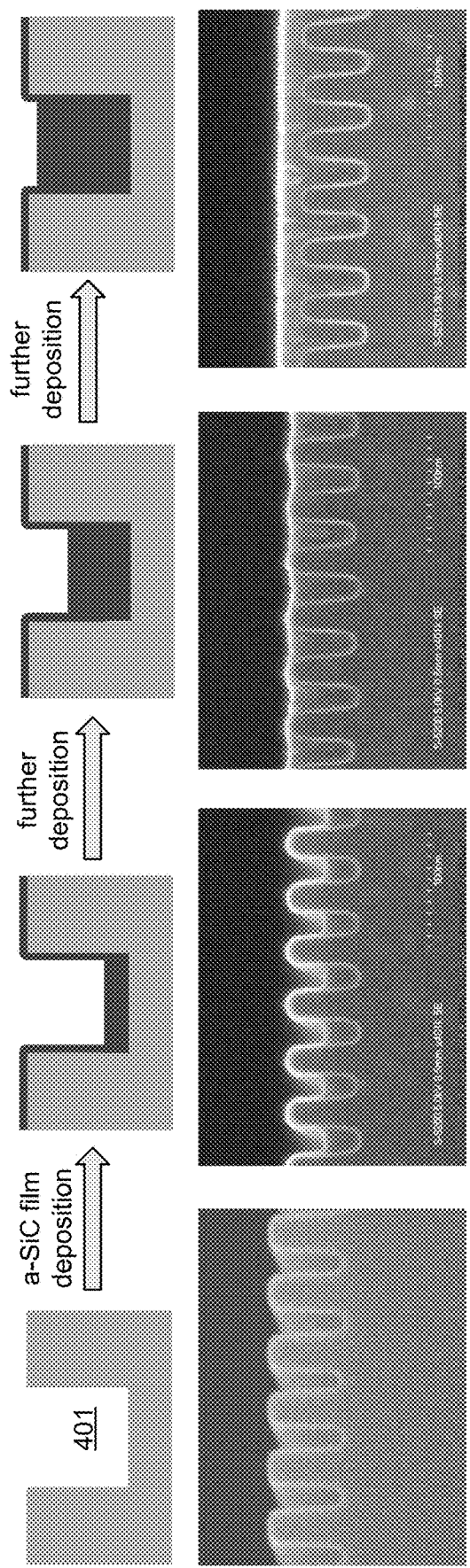
FIG. 4 shows a cross-sectional schematic diagram and counterpart SEM images of 3:1 AR, 25 nm features filled with amorphous carbon using a He/$CH_4$ process gas in a HDP CVD process at various stages during the deposition.

A similar effect is observed in depositing a-C films in trenches. FIG. 4 shows a cross-sectional schematic diagram and counterpart SEM images of 3:1 AR, 25 nm trenches 401 filled using a $He/CH_4$ process gas in a HDP CVD process at various stages during the deposition. The deposition may be characterized as largely bottom-up, resulting in trenches filled with void-free a-C. By contrast, a $He/C_2H_2$ process gas results in void formation due to sidewall cusp development and premature gap closure (not shown).

Without being bound by a particular theory, it is believed that cusp suppression is due to etch by H species such as hydrogen radicals (i.e., atomic H) at the top of the gap during deposition. Neutral and low mass species in the plasma preferentially etch at the top of the gap, allowing fill in the bottom part of the feature and etch at the top. This effect can counteract the above-described factors that lead to cusp deposition.

Gap fill of carbon-based films using non-hydrogen enriched process gases, other hydrocarbon precursors, or other techniques such as plasma-enhanced chemical vapor deposition (PECVD) does not exhibit the same cusp suppression that is exhibited by the hydrogen-enriched HDP CVD processes. As such, they cannot be used for high quality, void free, single stage gap fill.

Figure 5:
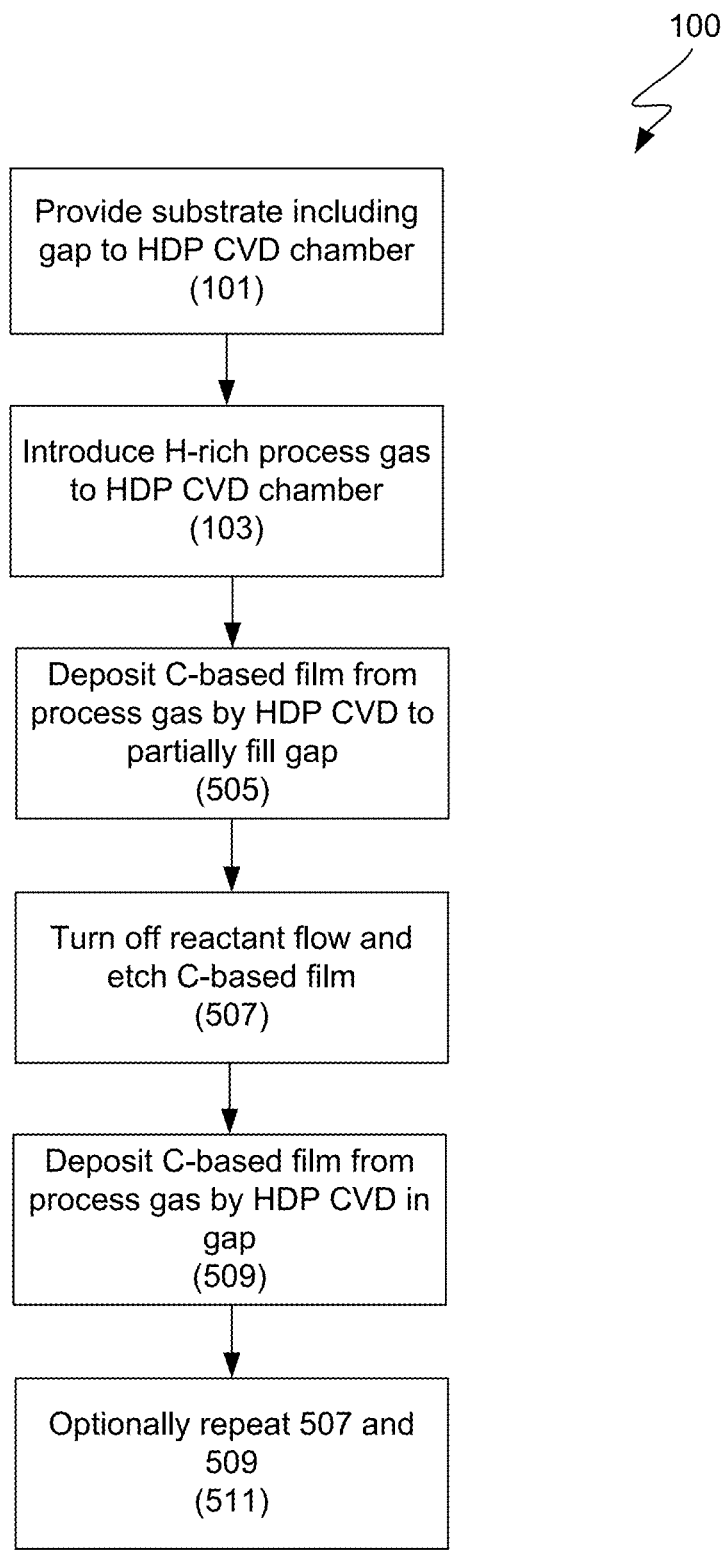
FIG. 5 provides a process flow diagram illustrating operations in an example of a method of filling a gap according to various embodiments.

In some embodiments, the methods may include one or more deposition-etch-deposition cycles. Such a process may be used, for example, to fill particularly challenging structures. FIG. 5 provides a process flow diagram illustrating operations in an example of a method of filling a gap according to various embodiments.

As shown, a deposition process 500 begins at block 101 in which a substrate containing a gap is provided to a HDP CVD reaction chamber. This operation may be performed as described above with respect to FIG. 1. A H-rich process gas is then introduced to the HDP CVD chamber. Block 103. This may also be performed as described above with respect to FIG. 1.

A carbon-based film is then deposited to partially fill the gap. Block 505. Deposition is stopped prior to closure of the gap. In some embodiments, the deposited film may exhibit nascent cusp formation, a re-entrant profile, or otherwise present a challenging-to-fill structure. While any cusp formation will be less than in the absence of a hydrogen-rich process gas, it may be useful to halt the deposition and employ a dedicated etch operation to appropriately tailor the profile of the film partially filling the gap.

At 507, reactant flow is turned off and the carbon-based film is etched. Because the reactant flow is turned off, the deposition is halted. In some embodiments, hydrogen radicals or other hydrogen species are the primary etchant. In some such embodiments, transitioning from block 505 to block 507 may involve turning off one or more reactant flows while allowing $H_2$ to continue to flow. While block 507 may occur in the HDP CVD reactor in some embodiments, the substrate may also be transferred to an etch chamber to be etched. Any appropriate etchant may be used, including a fluorine-based etch, etc. One or more additional etchant gases may be added to hydrogen in hydrogen-based etches. Alternatively, hydrogen species may be the sole etchants, with no halogen etchants.

Block 507 may involve preferentially etching material at the top of the gap to appropriately shape the profile of the material in the gap. This may be referred to as a non-conformal etch or low-step coverage etch. Step coverage of the carbon-based film may be proportional to (etchant concentration)/etch rate. For example, for hydrogen radical etching, at higher temperatures, hydrogen radicals readily react and etch at the feature entrance, resulting in a more non-conformal etch; at lower temperature, the hydrogen radicals may be able to diffuse and etch further into the feature, resulting in a more conformal etch. Higher etchant flow rate will result in more etchant species generated, causing more species to diffuse and etch further into the feature, resulting in a more conformal etch. Lower etchant flow rate will result in fewer etchant species generated, which will tend to react and etch at the feature entrance, resulting in a more non-conformal etch.

At block 509, carbon-based film is deposited in the gap, this time on the etched carbon-based film that partially fills the gap. Block 509 typically involves HDP CVD deposition using a hydrogen-rich process gas as described above. In some embodiments, the gap may be filled after one dep-etch-dep sequence. Alternatively, blocks 507 and 509 can be repeated one or more times to fill the gap. Block 511.

In alternative embodiments, carbon-based gap fill may be performed by using a nitrogen-rich process gas. For example, a hydrogen-rich or carbon-rich hydrocarbon precursor as described above may be mixed with nitrogen ($N_2$).

Apparatus

The present invention may be implemented in a HDP CVD reactor. Such a reactor may take many different forms. Generally, the apparatus will include one or more chambers or "reactors" (sometimes including multiple stations) that house one or more wafers and are suitable for wafer processing. Each chamber may house one or more wafers for processing. The one or more chambers maintain the wafer in a defined position or positions (with or without motion within that position, e.g. rotation, vibration, or other agitation). While in process, each wafer is held in place by a pedestal, wafer chuck and/or other wafer holding apparatus. For certain operations in which the wafer is to be heated, the apparatus may include a heater such as a heating plate. An examples of a suitable reactor is the Speed™ reactor, available from Lam Research of Fremont, Calif.

Figure 6:
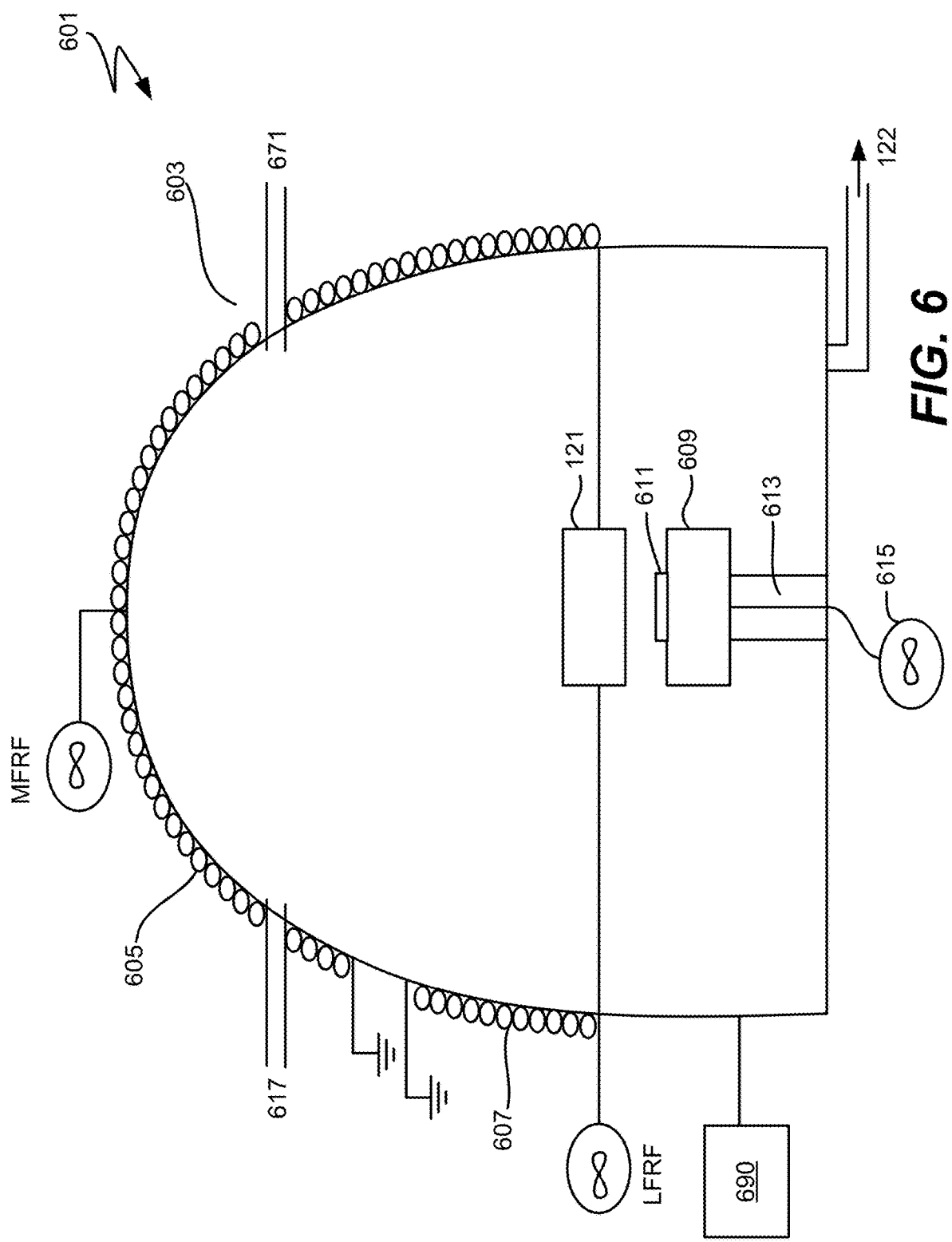
FIG. 6 provides a simple block diagram depicting various reactor components arranged as may be arranged in a reactor.

FIG. 6 provides a simple block diagram depicting various reactor components arranged as may be arranged in a reactor. As shown, a reactor 601 includes a process chamber 603 which encloses other components of the reactor and serves to contain the plasma. In one example, the process chamber walls are made from aluminum, aluminum oxide, and/or other suitable material. The embodiment shown in FIG. 6 has two plasma sources: top RF coil 605 and side RF coil 607. Top RF coil 605 is a medium frequency (MFRF) coil and side RF coil 607 is a low frequency (LFRF) coil. In the embodiment shown in FIG. 6, MFRF frequency may be from 430-470 kHz and LFRF frequency from 340-370 kHz. However, the methods and apparatus are not limited to operation in reaction chambers with dual sources, these frequencies, or RF plasma sources. Any suitable plasma source or sources may be used.

Within the reactor, a wafer pedestal 609 supports a substrate 611. The pedestal typically includes a chuck (sometimes referred to as a clamp) to hold the substrate in place during the deposition reaction. The chuck may be an electrostatic chuck, a mechanical chuck or various other types of chuck as are available for use. A heat transfer subsystem including a line 613 for supplying heat transfer fluid controls the temperature of substrate 611. The wafer chuck and heat transfer fluid system can facilitate maintaining the appropriate wafer temperatures.

A high frequency RF of HFRF source 615 serves to electrically bias substrate 611 and draw charged reactant species onto the substrate for the deposition reaction. Electrical energy from source 615 is coupled to substrate 611 via an electrode or capacitive coupling, for example. Note that the bias applied to the substrate need not be an RF bias. Other frequencies and DC bias may be used as well.

The hydrogen-rich process gas is introduced via one or more inlets 617. The component gases of the process gas may be premixed or not. In some embodiments, the process gas is introduced through a gas supply inlet mechanism including orifices. In some embodiments, at least some of the orifices orient the process gas along an axis of injection intersecting an exposed surface of the substrate at an acute angle. Further, the gas or gas mixtures may be introduced from a primary gas ring 621, which may or may not direct the gases toward the pedestal. In some embodiments, gases may be introduced from one or more gas rings (not shown) in addition to the primary gas ring 621. Injectors may be connected to the primary gas ring 621 to direct at least some of the gases or gas mixtures into the chamber and toward the pedestal. Note that injectors, gas rings or other mechanisms for directing process gas toward the wafer may not be used in some embodiments; any appropriate process gas delivery system may be employed. The sonic front caused by a process gas entering the chamber will itself cause the gas to rapidly disperse in all directions—including toward the substrate. Process gases exit chamber 603 via an outlet 622. A vacuum pump (e.g., a turbomolecular pump) typically draws process gases out and maintains a suitably low pressure within the reactor. The reactor 601 may be controlled using a controller 690. The controller 690 may include machine-readable instructions for performing various operations disclosed herein. Further description regarding the controller 690 is provided below.

Figure 7:
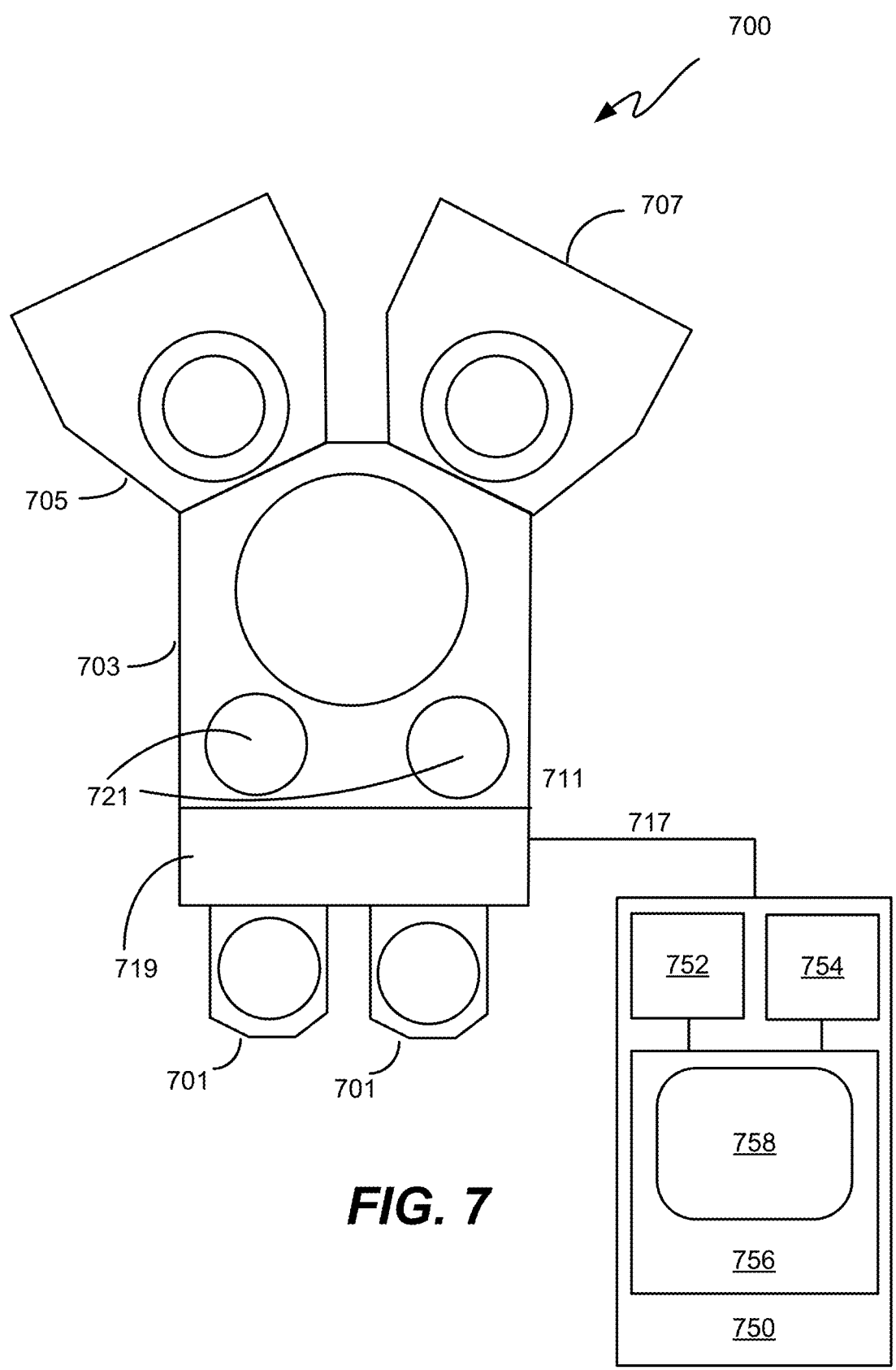
FIG. 7 is a block diagram of a system suitable for conducting a deposition process in accordance with disclosed embodiments.

In some embodiments, an HDP CVD reactor, such as the reactor 601 shown in FIG. 6 is part of a tool for processing one or more wafers. An example of a tool including one or more reactors is provided in FIG. 7. FIG. 7 is a block diagram of a system suitable for conducting a deposition process in accordance with disclosed embodiments. The system 700 includes a transfer module 703, such as the wafer transfer system (WTS) used on the SPEED™ platform available from Lam Research Corporation of Fremont, Calif. The transfer module 703 provides a clean, pressurized environment to minimize the risk of contamination of workpieces, such as wafers, being processed as they are moved between the various processing stages. Mounted on the transfer module 703 are one or more HDP CVD modules or process chambers 705, such as Lam SPEED™ reactors, available from Lam Research Corporation of Fremont, Calif. Also mounted on the transfer module 703 are one or more etch chambers 707. Examples of etch chambers include a Lam atomic layer removal (ALR) reactor or Kiyo™ reactor. These etch chambers may be mounted on the same or separate platforms as the one or more deposition reactors.

The system 700 also includes one or more (in this case two) wafer source modules 701 where wafers are stored before and after processing. A device (generally a robot arm unit) in the transfer module 703 moves the wafers among the modules mounted on the transfer module 703.

Wafers are transferred by the robot arm between the HDP CVD reactor 705 and/or the etch chamber 707 for deposition and etch back processing, respectively. In one embodiment, a single etch reactor can support two SPEED deposition modules 705 with a high throughput of about 15-16 wafers per hour (wph). In other embodiments, two etch reactors 707 may support one or more SPEED deposition modules 705.

Disclosed embodiments may also be practiced without a plasma etch chamber. For example, a single chamber may be configured for both HDP CVD deposition and etch. For example, the Lam SPEED HDP-CVD reactors are capable of deposition and etch with a throughput similar to that of using separate reactors. Given the details and parameters provided herein, a single chamber may be configured, for example, a plasma reactor, with equipment, for example the various plasma sources described herein, for deposition (HDP CVD) and a reactive plasma etch (e.g., in-situ or downstream plasma source).

FIG. 7 also depicts an embodiment of a system controller 750 employed to control process conditions and hardware states of process tool 700. The system controller 750 may provide program instructions for implementing the above-described processes. The program instructions may control a variety of process parameters, such as DC power level, RF bias power level, pressure, temperature, etc. The instructions may control the parameters to perform deposition operations according to various embodiments described herein.

In some implementations, a controller 750 is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 750, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 750 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

In some embodiments, the system controller 750 controls all of the activities of process tool 700. The system controller 750 may include one or more memory devices 756, one or more mass storage devices 754, and one or more processors 752. A processor 752 may include a CPU or computer, analog and/or digital input/output connections, stepper motor controller boards, etc. The system controller 750 executes system control software 758 stored in a mass storage device 754, loaded into memory device 756, and executed on processor 752. Alternatively, the control logic may be hard coded in the controller 750. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 758 may include instructions for controlling the transfer of wafers into and out of a process chamber, timing of gases, mixture of gases, amount of gas flow, chamber and/or station pressure, chamber and/or reactor temperature, wafer temperature, bias power, target power levels, RF power levels, pedestal, chuck and/or susceptor position, and other parameters of a particular process performed by process tool 700. The system control software 758 may be configured in any suitable way. For example, various process tool component subroutines or control objects may be written to control operation of the process tool components necessary to carry out various process tool processes. System control software 758 may be coded in any suitable computer readable programming language.

The controller 750, in some implementations, may be a part of or coupled to a computer that is integrated with, coupled to the system, otherwise networked to the system, or a combination thereof. For example, the controller 750 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 750 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 750 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In some embodiments, system control software 758 may include input/output control (IOC) sequencing instructions for controlling the various parameters described above. Other computer software and/or programs stored on mass storage device 754 and/or memory device 756 associated with system controller 750 may be employed in some embodiments. Examples of programs or sections of programs for this purpose include a wafer positioning program, a process gas control program, a pressure control program, a heater control program, and a plasma control program.

A wafer positioning program may include program code for process tool components that are used to load a wafer onto pedestal 718. A process gas control program may include code for controlling gas composition (e.g., process gases, helium gas or carrier gases, etc., as described herein) and flow rates and optionally for flowing gas into one or more process chambers or stations prior to deposition in order to stabilize the pressure therein. A pressure control program may include code for controlling the pressure in the process chamber by regulating, for example, a throttle valve in the exhaust system of the process chamber, a gas flow into the process chamber, etc.

A heater control program may include code for controlling the current to a heating unit that is used to heat the wafer or other workpiece. Alternatively, the heater control program may control delivery of a heat transfer gas (such as helium) to the wafer. A plasma control program may include code for setting RF power levels applied to the process electrodes and the bias in one or more process chambers or stations in accordance with the embodiments herein. A pressure control program may include code for maintaining the pressure in the reaction chamber in accordance with the embodiments herein.

In some embodiments, there may be a user interface associated with system controller 750. The user interface may include a display screen, graphical software displays of the apparatus and/or process conditions, and user input devices such as pointing devices, keyboards, touch screens, microphones, etc.

In some embodiments, parameters adjusted by system controller 750 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface.

Signals for monitoring the process may be provided by analog and/or digital input connections of system controller 750 from various process tool sensors. The signals for controlling the process may be output on the analog and digital output connections of process tool 700. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Process Parameters

As noted above, gap fill is performed by HDP CVD. HDP CVD as used herein is distinct from plasma-enhanced chemical vapor deposition techniques, also known as PECVD. HDP CVD reactors typically employ inductively-coupled plasmas, while PECVD reactors typically employ capacitively-coupled plasmas. HDP CVD process conditions and resulting films are different PECVD processes. For example, various HDP reactors as described herein operate at a pressure less than about 100 mTorr with a plasma density greater than $10^{17}$ ions/$m^3$, e.g., $10^{17}$ ions/$m^3$ to $10^{19}$ ions/$m^3$. By contrast, PECVD processes operate at much higher pressures with much lower plasma densities, e.g., $10^{14}$ ions/$m^3$ to $10^{16}$ ions/$m^3$.

HDP reactors may ignite plasma at a plasma frequency of 400 kHz for coils and a frequency of 13.56 MHz for the pedestal where the wafer is placed. By contrast, an a capacitively-coupled plasma reactor, a plasma frequency of 13.56 MHz is used to generate plasma as applied to either a showerhead or the pedestal, and 400 kHz is applied to either the showerhead or the pedestal. Ion energies in HDP reactors may be greater than in PECVD reactors. As a result, film composition and characteristics of films deposited in HDP CVD reactors are different than those deposited in PECVD reactors. For carbon-based gap fill, the lower plasma densities in PECVD typically cannot generate hydrogen radicals in an amount effective to suppress cusp formation even using hydrogen-rich process gases.

The plasma source power is high enough to sustain a plasma and low enough so that the effect of the $H^+$ ions does not overwhelm that of the hydrogen radicals. Note that the RF power will depend on the substrate size (e.g., 200 mm, 300 mm, or 450 mm diameter wafer) and the requirements of the specific process being used. An example range is between about 3000 W and 6000 W for a 300 mm wafer, with plasma power scaling with substrate surface area.

Substrate temperature and chamber pressure during may be generally with the ranges commonly used during HDP CVD processes. Temperature values may range from about 200° C. and 1000° C., with typical ranges between about 300° C. and 550° C., e.g., 400° C. Pressure is typically maintained at a value below 500 mTorr, and can be significantly lower, e.g., below 100 mTorr or 10 mTorr. In one example, pressure is 6 mTorr.

While the methods may be practiced on any substrate in which it is desirable to fill a gap with carbon-based material, they are particularly applicable to filling gaps having one or more of high aspect ratios and narrow widths. Example aspect ratios may range from 3:1 to 30:1, or 3:1 to 10:1. Example trench widths may range from 10 nm to 100 nm, for example 50 nm or less, or 25 nm or less.

A HFRF power source or other source may be used to bias the substrate. Substrates are typically biased during deposition operations to direct charged species downward, to the bottom of the gap. As discussed above, it is believed that the hydrogen-rich process gas improves gap fill by a chemical etch at the top of the gap. During a dedicated etch process such as block 507, the substrate may or may not be biased. Example HF bias powers during HDP CVD are between 0 to 9500 W about for a 300 mm system, with bias power scaling with substrate surface area.

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method comprising:
   introducing a process gas to a high density plasma chemical vapor deposition (HDP CVD) chamber that houses a substrate having a gap, wherein the process gas includes a hydrocarbon reactant and has a H:C ratio of at least 4:1; and
   filling the gap with an amorphous carbon (a-C) film by an HDP CVD reaction of the process gas.

2. The method of claim 1, wherein the gap is filled in a single deposition operation with no intervening etch operations.

3. The method of claim 1, wherein the hydrocarbon reactant has a H:C ratio of at least 3:1.

4. The method of claim 1, wherein the hydrocarbon reactant has a H:C ratio of at least 4:1.

5. The method of claim 1, wherein the process gas includes molecular hydrogen ($H_2$).

6. The method of claim 1, further comprising generating a plasma including hydrogen radicals.

7. The method of claim 1, wherein the filling the gap comprises a hydrogen radical etch at a top of the gap during the HDP CVD reaction.

8. The method of claim 1, wherein filling the gap with an amorphous carbon film comprises two or more deposition stages and one or more intervening etch operations.

9. The method of claim 8, wherein the one or more intervening etch operations are hydrogen-based etches.

10. The method of claim 9, wherein transitioning from a deposition stage to an intervening etch operation comprises stopping flow of the hydrocarbon reactant to the HDP CVD chamber while maintaining flow of hydrogen ($H_2$) to the HDP CVD chamber.

11. The method of claim 1, wherein the hydrocarbon reactant is selected from ethane and methane.

12. The method of claim 1, wherein the hydrocarbon reactant is acetylene.

13. The method of claim 1, wherein neutral species preferentially etch material deposited at a top of the gap with respect to material deposited at a bottom of the gap during gap fill.

* * * * *